(12) United States Patent
Ueno et al.

(10) Patent No.: US 9,762,782 B2
(45) Date of Patent: Sep. 12, 2017

(54) CAMERA MODULE AND ELECTRONIC DEVICE

(71) Applicant: Sony Corporation, Tokyo (JP)

(72) Inventors: Toshihide Ueno, Kanagawa (JP); Tomomi Kume, Tokyo (JP); Masahiko Shimizu, Kumatomo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/408,110

(22) PCT Filed: Jun. 20, 2013

(86) PCT No.: PCT/JP2013/066912
§ 371 (c)(1),
(2) Date: Dec. 15, 2014

(87) PCT Pub. No.: WO2014/002860
PCT Pub. Date: Jan. 3, 2014

(65) Prior Publication Data
US 2015/0130975 A1 May 14, 2015

(30) Foreign Application Priority Data

Jun. 29, 2012 (JP) ................................. 2012-147878
Mar. 18, 2013 (JP) ................................. 2013-055149
May 28, 2013 (JP) ................................. 2013-111767

(51) Int. Cl.
*H04N 5/225* (2006.01)
*H01L 27/146* (2006.01)
*H01L 23/00* (2006.01)

(52) U.S. Cl.
CPC ........... *H04N 5/2253* (2013.01); *H01L 24/49* (2013.01); *H01L 27/14618* (2013.01);
(Continued)

(58) Field of Classification Search
CPC .................................................. H04N 5/2253
See application file for complete search history.

(56) References Cited

U.S. PATENT DOCUMENTS 6,979,902 B2 * 12/2005 Kinsman ........... H01L 27/14618
257/432
7,005,310 B2 * 2/2006 Hanada ............. H01L 27/14618
257/E31.117
(Continued)

FOREIGN PATENT DOCUMENTS

| JP | 2004-104078 | 4/2004 |
| JP | 2005-012207 | 1/2005 |

(Continued)

OTHER PUBLICATIONS

Office Action for EP Patent Application No. 13809413.1, dated Apr. 24, 2017, 4 pages.
(Continued)

*Primary Examiner* — James Hannett
(74) *Attorney, Agent, or Firm* — Chip Law Group

(57) ABSTRACT

The present invention relates to a camera module in which a thin camera module can be realized at a low cost and an electronic device. The camera module includes a lens unit that stores a lens that condenses light on a light receiving surface of an image sensor; a rigid substrate on which the image sensor is disposed; and a flexible substrate electrically connected with the rigid substrate, wherein in the case where the light receiving surface of the image sensor locates at the top, the lens unit, the flexible substrate, and the rigid substrate are disposed in this order from the top.

21 Claims, 25 Drawing Sheets

(52) U.S. Cl.
CPC ......... *H04N 5/2254* (2013.01); *H04N 5/2257* (2013.01); *H01L 24/48* (2013.01); *H01L 2224/05554* (2013.01); *H01L 2224/05599* (2013.01); *H01L 2224/48091* (2013.01); *H01L 2224/48227* (2013.01); *H01L 2224/49175* (2013.01); *H01L 2224/854* (2013.01); *H01L 2924/00014* (2013.01); *H01L 2924/15311* (2013.01); *H01L 2924/181* (2013.01)

(56) References Cited

U.S. PATENT DOCUMENTS

2004/0027477 A1* 2/2004 Tamura ................ H04N 5/2253
　　　　　　　　　　　　　　　　　　　　　　　348/340
2006/0091487 A1　　5/2006 Hanada et al.

FOREIGN PATENT DOCUMENTS

| JP | 2005-072978 | 3/2005 |
| JP | 2009-033481 | 2/2009 |
| JP | 2010-114400 | 5/2010 |

OTHER PUBLICATIONS

Office Action for CN Patent Application No. 201380033013.2, dated May 3, 2017, 7 pages of Office Action and 7 pages of English Translation.

* cited by examiner

CAMERA MODULE AND ELECTRONIC DEVICE

TECHNICAL FIELD

The present technology relates to a camera module and an electronic device, and in particular, to a camera module in which a thin camera module can be realized at a low cost and an electronic device.

BACKGROUND ART

In a conventional camera module structure, FPC (Flexible Printed Circuits) are disposed on the lower side of a module and are connected by soldering or by ACF (Anisotropic Conductive Film) (for example, see Patent Document 1).

As such, the thickness of the FPC and the thickness of the connecting portion (solder connection or ACF connection) are included in the height of the module such as a lens unit, whereby there is a problem that the thickness of the module increases.

Meanwhile, a rigid flexible substrate, in which a rigid portion and a flexible portion are integrated, may also be used. In that case, there is no need to take into account a connection between the rigid substrate and the FPC.

CITATION LIST

Patent Document

Patent Document 1: Japanese Patent Application Laid-Open No. 2009-033481

SUMMARY OF THE INVENTION

Problems to be Solved by the Invention

However, in the case of using a rigid flexible substrate, constraints on the design increases, compared with the case of a configuration in which a rigid substrate and FPC are connected, for example.

For example, in the case of using a rigid flexible substrate, as it is necessary to conform the pitch of vias and the width of wiring to design rules of the flexible portion in the substrate, it is difficult to perform fine wiring in the rigid portion in the substrate.

Further, in the case of using a rigid flexible substrate, as a layer constituting the flexible portion is inserted between layers constituting the rigid portion, a range of process conditions such as an ultrasonic wave, temperature setting, and the like becomes narrow when an image sensor is wire-bonded, and the like.

Further, in the case of using a rigid flexible substrate, as a member usage rate decreases in each of the layer constituting the rigid portion and the layer constituting the flexible portion, the substrate cost increases. As such, it is difficult to suppress the cost of the entire camera module.

Further, in the case of using a rigid flexible substrate, when attempting to change the shape of the flexible portion corresponding to a device (mobile telephone, smartphone, or the like) in which the camera module is incorporated, for example, it is necessary to redesign the entire substrate including the rigid portion. As such, the delivery period of the substrate becomes longer, for example, and the cost further increases.

The present technology is disclosed in view of such a situation, and aims to realize a thin camera module at a low cost.

Solutions to Problems

A first aspect of the present technology is a camera module including: a lens unit that stores a lens that condenses light on a light receiving surface of an image sensor; a rigid substrate on which the image sensor is disposed; and a flexible substrate electrically connected with the rigid substrate, wherein in a case where the light receiving surface of the image sensor locates at the top, the lens unit, the flexible substrate, and the rigid substrate are disposed in this order from the top.

In the rigid substrate of a square shape, in an overlap region of a band shape having a predetermined distance from an end of one side of the square, the rigid substrate is disposed to overlap a portion of the flexible substrate, and the rigid substrate and the flexible substrate are attached to each other.

The overlap region is a band-shaped region having a width of 2.4 mm or less.

In the flexible substrate, besides the overlap region, a reinforced region in which the flexible substrate overlaps the rigid substrate is provided.

The reinforced region is provided to extend in parallel with two sides of the image sensor of the square shape.

The reinforced region is provided to extend in parallel with one side of the image sensor of the square shape.

In the rigid substrate of a square shape, a solder resist is removed in a band-shaped region having a predetermined distance from an end of one side of the square.

A groove for accommodating an end portion of the flexible substrate is formed in the lens unit.

A frame is further provided between the lens unit and the flexible substrate.

A groove for accommodating an end portion of the flexible substrate is formed in the frame.

An electrode pad of the image sensor and an embedded electrode provided in the flexible substrate are connected with each other by wire bonding, and a signal output from the electrode pad of the image sensor is transmitted to the rigid substrate through the embedded electrode.

The embedded electrode is formed by punching all layers of the flexible substrate having a multilayer structure to thereby form an opening, and embedding metal in the opening.

The electrode pad is formed by punching an uppermost layer of the flexible substrate having a multilayer structure to thereby form an opening, and embedding metal in the opening, and an electrode pad of the image sensor and the electrode pad provided in the flexible substrate are connected with each other by wire bonding.

An electrode pad of the image sensor and a stud bump protruding on the rigid substrate are connected by wire bonding.

An opening is formed by punching all layers of the flexible substrate having a multilayer structure, and the stud bump is formed on an electrode pad which is on the rigid substrate and is located at a position corresponding to the opening.

In the flexible substrate having a multilayer structure, an opening formed by punching all layers and an opening formed by punching an uppermost layer of the flexible substrate are provided in a region connected with an electrode pad of the image sensor by wire bonding.

In the first aspect of the present technology, in a case where the light receiving surface of the image sensor locates at the top, the camera module is configured such that the lens unit, the flexible substrate, and the rigid substrate are disposed in this order from the top.

A second aspect of the present technology is a camera module manufactured by a method including the steps of: disposing a rigid substrate; connecting a flexible substrate with the rigid substrate; and disposing a lens unit on the rigid substrate, the lens unit storing a lens that condenses light on a light receiving surface of the image sensor, wherein in the step of connecting the flexible substrate with the rigid substrate, in the rigid substrate of a square shape, in an overlap region of a band shape having a predetermined distance from an end of one side of the square, the rigid substrate is disposed to overlap a portion of the flexible substrate, and the rigid substrate and the flexible substrate are attached to each other.

In the second aspect of the present technology, a rigid substrate is disposed; a flexible substrate is connected with the rigid substrate; and a lens unit is disposed on the rigid substrate, the lens unit storing a lens that condenses light on a light receiving surface of an image sensor, wherein in the step of connecting the flexible substrate with the rigid substrate, in the rigid substrate of a square shape, in an overlap region of a band shape having a predetermined distance from an end of one side of the square, the rigid substrate is disposed to overlap a portion of the flexible substrate, and the rigid substrate and the flexible substrate are attached to each other.

A third aspect of the present technology is an electronic device including a camera module including: a lens unit that stores a lens that condenses light on a light receiving surface of an image sensor; a rigid substrate on which the image sensor is disposed; and a flexible substrate electrically connected with the rigid substrate, wherein in a case where the light receiving surface of the image sensor locates at the top, the lens unit, the flexible substrate, and the rigid substrate are disposed in this order from the top.

In the third aspect of the present technology, in a case where the light receiving surface of the image sensor locates at the top, the camera module is configured such that the lens unit, the flexible substrate, and the rigid substrate are disposed in this order from the top.

Effects of the Invention

According to the present technology, a thin camera module can be realized at a low cost.

MODE FOR CARRYING OUT THE INVENTION

Hereinafter, embodiments of the technology disclosed herein will be described with reference to the drawings.

Figure 1:
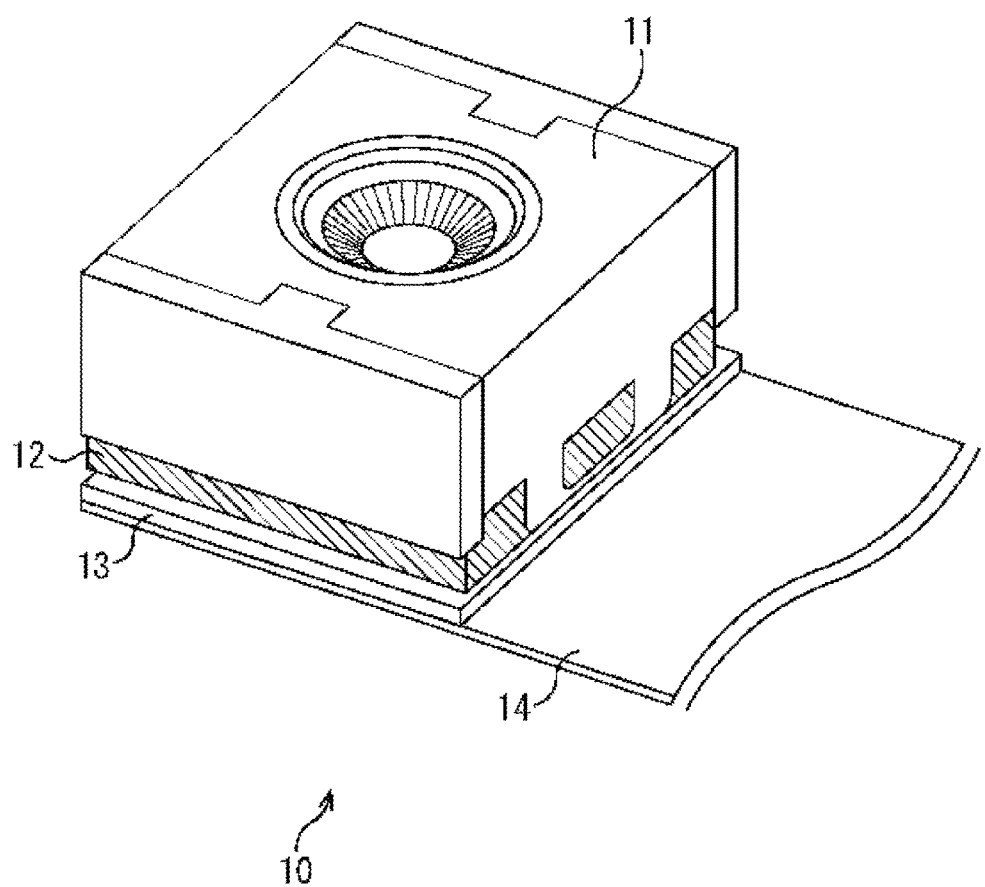
FIG. 1 is a perspective view illustrating an exemplary configuration of a conventional camera module.

FIG. 1 is a perspective view illustrating an exemplary configuration of a conventional camera module. A camera module 10 illustrated in the figure is to be installed in an electronic device such as a mobile telephone or a smartphone.

The camera module 10 in FIG. 1 is configured of a lens unit 11, a frame 12, a rigid substrate 13, and a flexible substrate 14. A flexible substrate is also referred to as FPC (Flexible Printed Circuits).

The lens unit 11 is a unit which stores a lens of the camera, and the like. Light condensed through the lens in the lens unit 11 forms an image on a light receiving surface of an image sensor, described below, whereby an image is captured.

The frame 12 is a standardized connecting component to be used for connection with the rigid substrate 13, for example, and is also used for improving shielding property, and the like. It should be noted that the frame 12 may not be provided. In that case, the lens unit 11 is directly attached to the rigid substrate 13.

The rigid substrate 13 is a substrate on which an image sensor of the camera is disposed, for example.

The flexible substrate 14 is a substrate on which wiring for inputting and outputting signals, input or output to/from the camera module 10, to/from another unit of an electronic device is printed, for example. In the example of FIG. 1, the flexible substrate 14 is attached to the bottom surface (surface on the lower side in the figure) of the rigid substrate 13.

Figure 2:
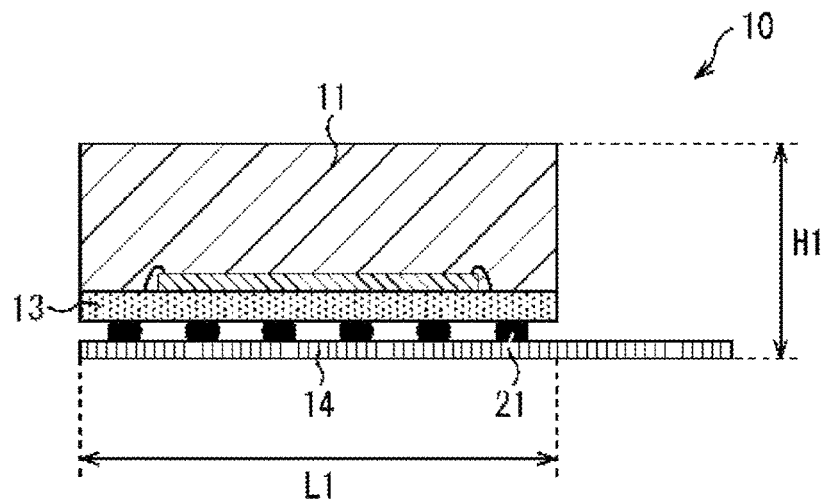
FIG. 2 is a side view explaining an exemplary configuration of a conventional camera module.

FIG. 2 is a side view explaining an exemplary configuration of the conventional camera module 10. It should be noted that in the camera module 10 illustrated in FIG. 2, the frame 12 in FIG. 1 is not provided and the lens unit 11 is directly attached to the rigid substrate 13.

Further, in the example of FIG. 2, the flexible substrate 14 is attached to the bottom surface of the rigid substrate 13, which is the same as the case explained with reference to FIG. 1. It should be note that in this example, solder balls 21 used for attaching the flexible substrate 14 and the rigid substrate 13 are illustrated.

The thickness (height in the figure) of the camera module 10, configured as illustrated in FIG. 2, is represented as H1, and the height H1 includes the thickness of the flexible substrate 14 and the thickness of the solder ball 21. Further, the length, in a horizontal direction in the figure, of the camera module 10 is represented as L1. It should be noted that in this example, the length in the horizontal direction of the camera module 10 does not include a portion where only the flexible substrate 14 exists.

However, as mobile telephones and smartphones are getting thinner increasingly in recent years, it is natural that thinner camera modules are also expected.

As such, it is considered to use a rigid flexible substrate in which a rigid portion and a flexible portion are integrated, for example. In that case, it is not necessary to consider connection between the rigid substrate and the flexible substrate.

However, in the case of using a rigid flexible substrate, constraints on the design increases, compared with the case of a configuration in which a rigid substrate and a flexible substrate are connected (attached) with each other.

For example, in the case of using a rigid flexible substrate, as it is necessary to conform the pitch of vias and the width of wiring to the design rules of the flexible portion in the substrate, it is difficult to perform fine wiring in the rigid portion in the substrate.

Further, in the case of using a rigid flexible substrate, as a layer constituting the flexible portion is inserted between layers constituting the rigid portion, a range of process conditions such as an ultrasonic wave, temperature setting, and the like becomes narrow when an image sensor is wire-bonded.

Further, in the case of using a rigid flexible substrate, as a member usage rate decreases in each of the layer constituting the rigid portion and the layer constituting the flexible portion, the substrate cost increases. As such, it is difficult to suppress the cost of the entire camera module.

Further, in the case of using a rigid flexible substrate, when attempting to change the shape of the flexible portion corresponding to a device (mobile telephone, smartphone, or the like) in which the camera module is incorporated, for example, it is necessary to redesign the entire substrate including the rigid portion. In that case, the delivery period of the substrate becomes longer, for example, and the cost further increases.

Figure 3:
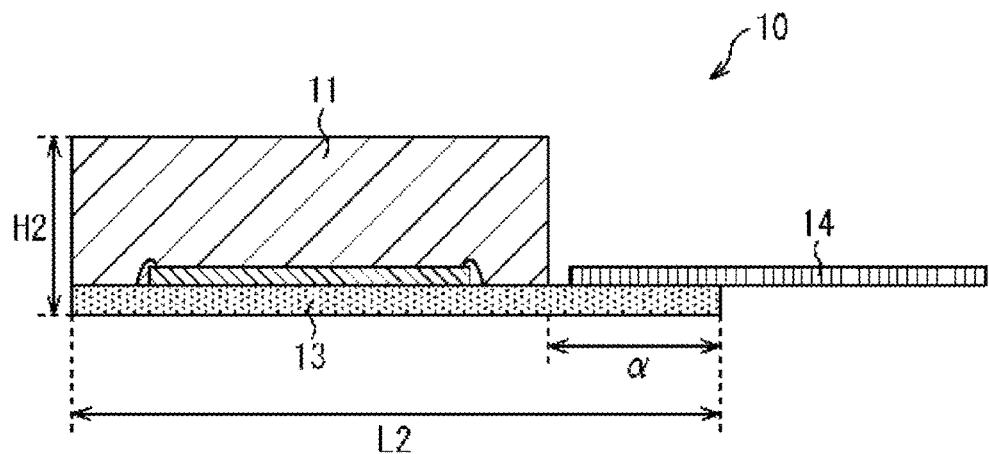
FIG. 3 is a side view illustrating an exemplary configuration of a modification of the camera module illustrated in FIG. 2.

Meanwhile, as illustrated in FIG. 3, the rigid substrate 13 may be configured to protrude from the bottom surface of the lens unit 11 in order to reduce the thickness of the entire module to thereby allow the flexible substrate 14 to be attached on the surface (surface on the upper side in the figure) of the rigid substrate 13.

In the case of configuring the camera module 10 as illustrated in FIG. 3, as the thickness of the flexible substrate 14 and the thickness of the solder ball 21 are canceled, the thickness of the camera module 10 is H2, which is less than H1. As such, it is possible to configure the camera module 10 to be thinner, compared with the case of FIG. 1.

However, in the case of configuring the camera module 10 as illustrated in FIG. 3, as the rigid substrate 13 extends in a horizontal direction in the figure by a length a, the length of the entire camera module in the horizontal direction in the figure also extends. In the example of FIG. 3, the length of the camera module 10 in the horizontal direction in the figure is L2 which is larger than L1.

As such, in the case of configuring the camera module 10 as illustrated in FIG. 3, for example, a mobile telephone, a smartphone, or the like must be designed while taking into account an increase in the length of the camera module 10 in the horizontal direction.

Figure 4:
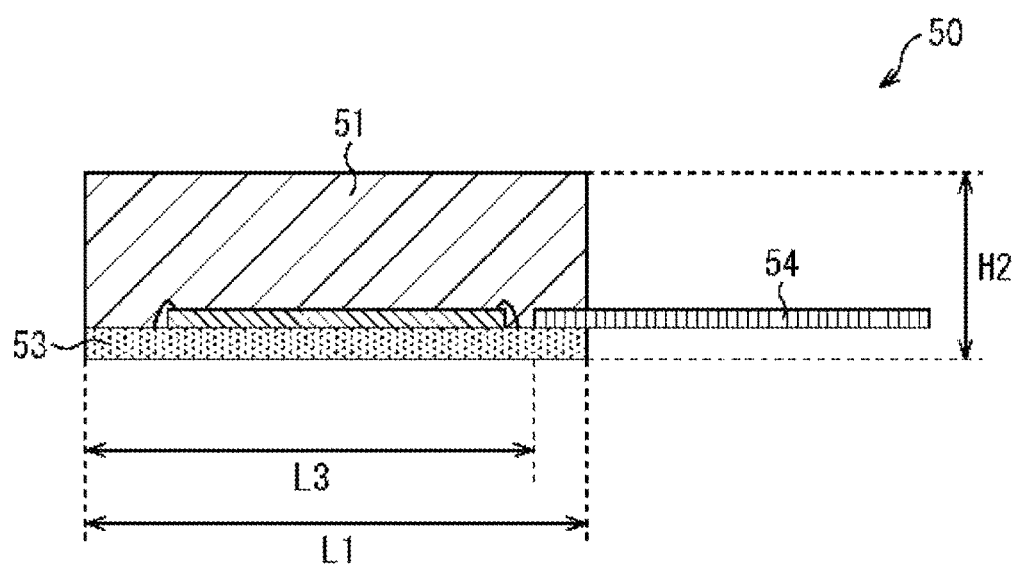
FIG. 4 is a side view explaining an exemplary configuration of a camera module to which the present technology is applied.

In view of the above, the present technology configures a camera module as illustrated in FIG. 4, for example.

FIG. 4 is a side view explaining an exemplary configuration of a camera module 50 to which the present technology is applied. It should be noted that in the camera module 50 illustrated in FIG. 4, the frame described in FIG. 1 is not provided, and a lens unit 51 is directly attached to the rigid substrate 53.

Further, in the camera module 50 illustrated in FIG. 4, a left end portion, in the figure, of a flexible substrate 54 is interposed between the lens unit 51 and the rigid substrate 53.

The camera module 50, to which the present technology is applied, is configured such that only an end portion on the left side, in the figure, of the flexible substrate 54 is attached to an end portion on the right side, in the figure, of the surface of the rigid substrate 53. Further, in the camera module 50 to which the present technology is applied, a groove for accommodating the left end portion of the flexible substrate 54 is provided on an end portion on the right side, in the figure, of the lens unit 51, the details of which will be described below.

In the case of configuring the camera module 50 as illustrated in FIG. 4, as the thickness of the flexible substrate 54 and the thickness of the solder ball are canceled, the thickness of the camera module 50 is H2. As such, it is possible to configure the camera module to be thinner, compared with the case of FIG. 1.

Further, in the case of configuring the camera module 50 as illustrated in FIG. 4, the length of the camera module 50 in the horizontal direction in the figure is L1. Accordingly, the length of the entire camera module in the horizontal direction in the figure does not extend, as in the configuration illustrated in FIG. 3.

Further, in the case of configuring the camera module 50 as illustrated in FIG. 4, the length of the flexible substrate 54 in the horizontal direction in the figure can be configured to be shorter. For example, the flexible substrate 54 in FIG. 4 is configured to have a length shorter by a length L3 in the horizontal direction in the figure, compared with the case of the flexible substrate 14 in FIG. 1, for example.

Accordingly, in the case of configuring the camera module 50 as illustrated in FIG. 4, the area of the flexible substrate can be reduced by the amount corresponding to the length L3, compared with the configuration of FIG. 1. This means that by applying the present technology, the area of an expensive flexible substrate is reduced, whereby the cost of the entire camera module can also be reduced.

Figure 5:
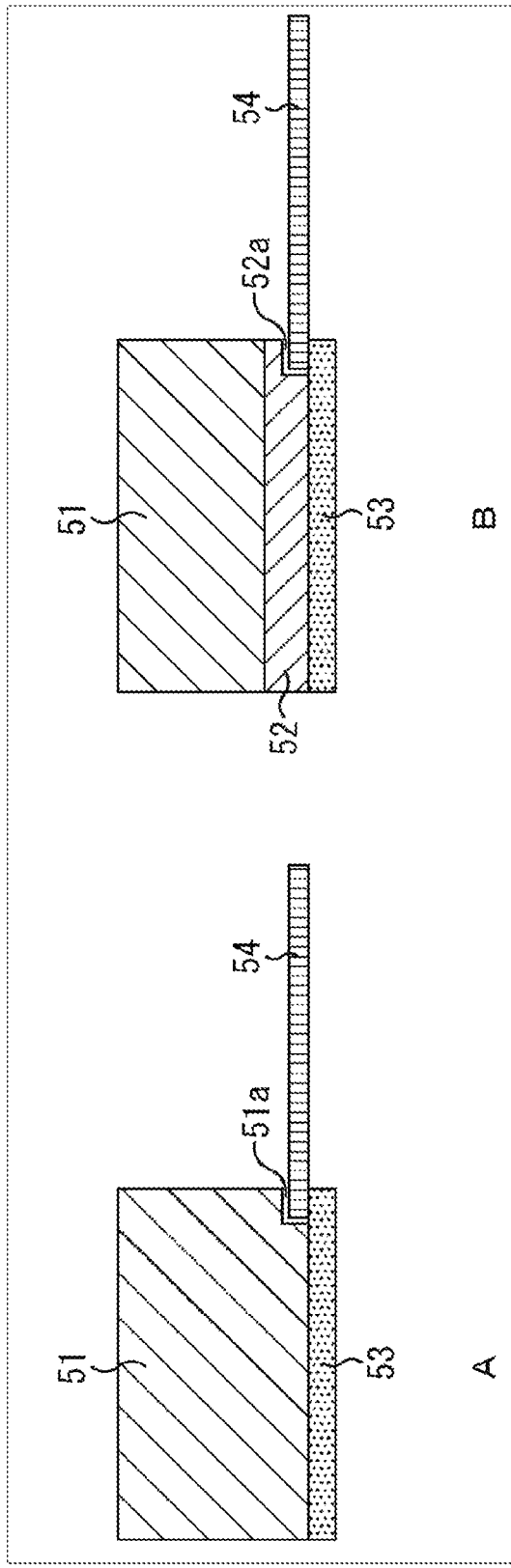
FIGS. 5A and 5B are another side views explaining an exemplary configuration of a camera module to which the present technology is applied.

FIGS. 5A and 5B are another side views explaining an exemplary configuration of the camera module 50 to which the present technology is applied. FIG. 5A is a diagram illustrating an exemplary configuration on the case where a frame is not provided in the camera module 50, and FIG. 5B is a diagram illustrating an exemplary configuration of the case where a frame is provided in the camera module 50.

In the camera module 50 illustrated in FIG. 5A, a left end portion, in the figure, of the flexible substrate 54 is interposed between the lens unit 51 and the rigid substrate 53.

The camera module 50, to which the present technology is applied, is configured such that only an end portion on the left side, in the figure, of the flexible substrate 54 is attached to an end portion on the right side, in the figure, of the surface of the rigid substrate 53. Further, in the example of FIG. 5A, a groove 51a for accommodating the left end portion of the flexible substrate 54 is formed in an end portion on the right side, in the figure, of the lens unit 51.

In the camera module 50 illustrated in FIG. 5B, a frame 52 is provided between the lens unit 51 and the rigid substrate 53, and a left end portion, in the figure, of the flexible substrate 54 is interposed between the frame 52 and the rigid substrate 53. Further, in the example of FIG. 5B, a groove 52a for accommodating the left end portion of the flexible substrate 54 is formed in an end portion on the right side, in the figure, of the frame 52.

If the groove 51a or the groove 52a is not formed, for example, the right side in the figure of the lens unit 51 floats due to the thickness of the flexible substrate 54, whereby there is a possibility that the light condensed by the lens in the lens unit 51 does not form an image appropriately on the imaging surface of the image sensor on the rigid substrate 53. Here, in order to allow the light condensed by the lens to form an image appropriately on the imaging surface of the image sensor, it is necessary that the parallel degree of the top surface (surface on the upper side in the figure) of the lens unit 51 and the imaging surface of the image sensor 61 becomes 1.5 degrees or smaller.

It should be noted that as the lens unit 51 or the frame 52 is attached to the rigid substrate 53 with an adhesive or the like, by adjusting the thickness of the adhesive, for example, it is possible to perform tilt adjustment so as to set the focus position of the lens in the lens unit 51 to be appropriate.

Further, if the groove 51a or the groove 52a is not formed, the right side, in the figure, of the lens unit 51 floats due to the thickness of the flexible substrate 54. As such, the adhesive must be injected in extra amounts for that portion, into a left-side portion in the figure. As such, the attachment strength of the lens unit 51 or the frame 52 may be insufficient, or light transmitted through the adhesive may leak in the image sensor.

However, if an adhesive having high shielding property is injected in a large amount in such a manner that the surface of the rigid substrate 53 and the bottom surface of the lens unit 51 (or the frame 52) become parallel to each other in a state where the flexible substrate 54 is interposed, the camera module may be configured without forming the groove 51a or the groove 52a.

Figure 6:
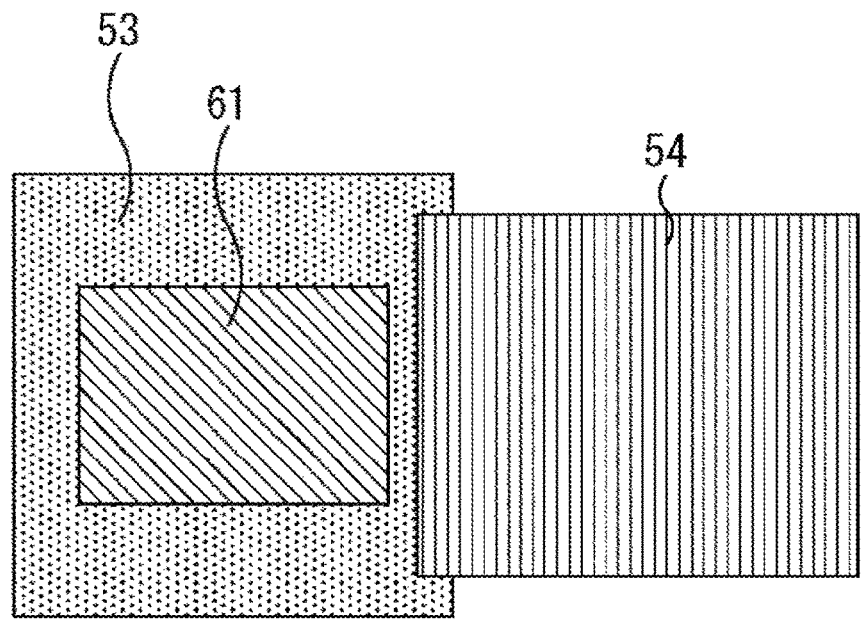
FIG. 6 is a plan view of the camera module illustrated in FIGS. 5A and 5B, seen from the upper direction of FIGS. 5A and 5B.

FIG. 6 is a plan view of the camera module 50 illustrated in FIGS. 5A and 5B, viewed from the upper direction of FIGS. 5A and 5B. It should be noted that in FIG. 6, the lens unit 51 and the frame 52 are not illustrated for easy understanding.

As illustrated in FIG. 6, a rectangle image sensor 61 is disposed on the almost center of the rigid substrate 53. It should be noted that in the figure, the front side of the sheet is the imaging surface of the image sensor 61. As illustrated in the figure, a portion on the left side, in the figure, of the flexible substrate 54 overlaps a portion on the right side, in the figure, of the rigid substrate 53. In the overlapped portion, the flexible substrate 54 and the rigid substrate 53 are attached, or electrically connected, to each other.

Further, as illustrated in FIG. 6, the flexible substrate 54 is disposed on the rigid substrate 53 (on the light receiving side of the image sensor 61).

Figure 7:
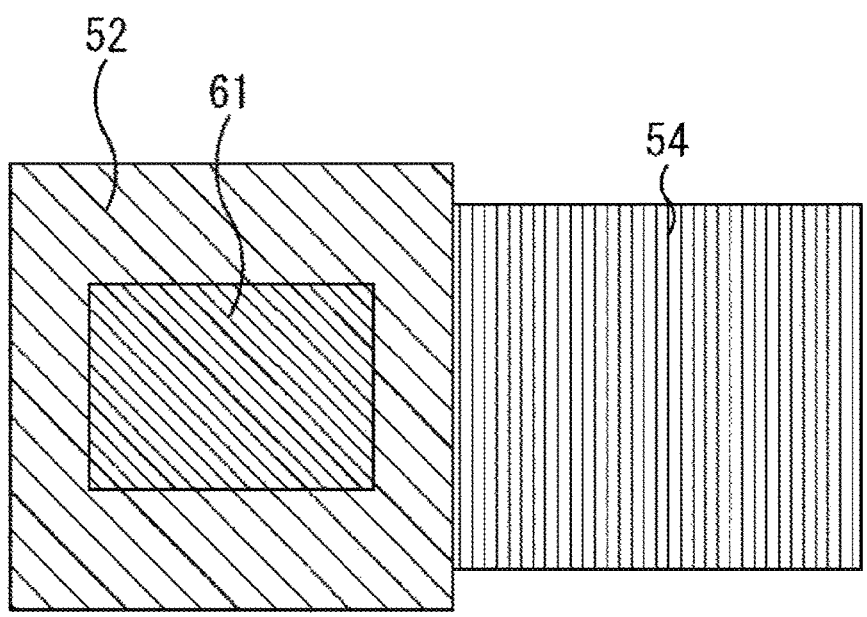
FIG. 7 is another plan view of the camera module illustrated in FIGS. 5A and 5B, seen from the upper direction of FIGS. 5A and 5B.

FIG. 7 is another plan view of the camera module 50 illustrated in FIGS. 5A and 5B, viewed from the upper direction of FIGS. 5A and 5B. In the case of FIG. 7, an illustration of the frame 52 is added, which is different from FIG. 6.

As illustrated in FIG. 7, a portion on the left side, in the figure, of the flexible substrate 54 overlaps a portion on the right side, in the figure, of the frame 52, and the flexible substrate 54 is disposed under the frame 52. Further, the center of the frame 52 is formed as a cavity, whereby the imaging surface of the image sensor 61 is seen.

Figure 8:
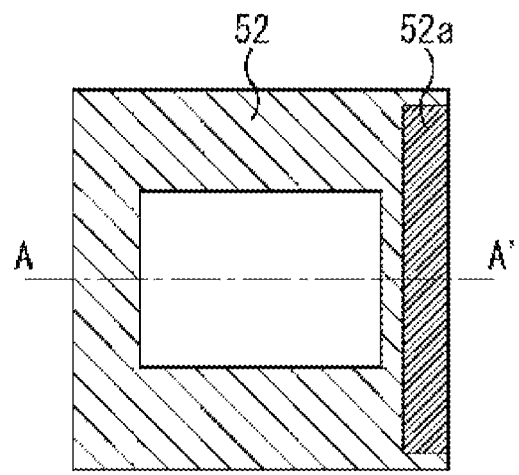
FIG. 8 is a plan view illustrating a detailed exemplary configuration of a frame of FIG. 7.

FIG. 8 is a plan view illustrating a detailed exemplary configuration of the frame 52 of FIG. 7. This figure is a diagram illustrating the frame 52 seen from the lower direction (rear side of the sheet) of FIG. 7, in which the bottom surface of the frame 52 is illustrated. As illustrated in FIG. 8, the groove 52a is formed on the right side, in the figure, of the frame 52. It should be noted that the center portion of the frame 52 is formed as a cavity, as described above.

Figure 9:
FIG. 9 is a cross-sectional view of the frame taken along an alternate long and short dash line A-A' of FIG. 8.

FIG. 9 is a cross-sectional view of the frame 52 taken along the alternate long and short dash line A-A' of FIG. 8. As illustrated in the figure, the groove 52a is formed on the right side in the figure.

Figure 10:
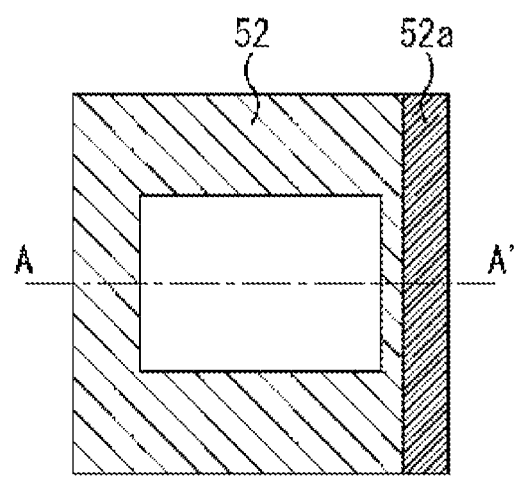
FIG. 10 is a plan view illustrating another detailed exemplary configuration of the frame of FIG. 7.

FIG. 10 is a plan view illustrating another detailed exemplary configuration of the frame 52 of FIG. 7. This figure is a diagram illustrating the frame 52 seen from the lower direction of FIG. 7, in which the bottom surface of the frame 52 is illustrated. As illustrated in FIG. 10, the groove 52a is formed on the right side, in the figure, of the frame 52. It should be noted that the center portion of the frame 52 is formed as a cavity, as described above.

In the example of FIG. 10, the groove 52a is formed across the rigid substrate 53 from the top to the bottom in the figure, which is different from the case of FIG. 8. The groove 52a may be formed in this way.

Figure 11:
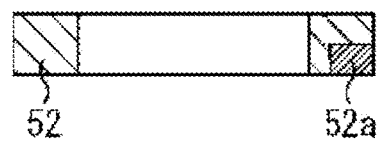
FIG. 11 is a cross-sectional view of the frame taken along an alternate long and short dash line A-A' of FIG. 10.

FIG. 11 is a cross-sectional view of the frame 52, taken along the alternate long and short dash line A-A' of FIG. 10. As illustrated in the figure, the groove 52a is formed on the right side in the figure.

It should be noted that while the case where the groove 52a is formed in the frame 52 has been described herein, this also applies to the case where the groove 51a is formed in the lens unit 51. This means that the groove 51a may be formed across the entire lens unit 51 from the top to the bottom as in the case of FIG. 10, or the groove 51a may be formed in such a manner that the upper side and the lower side of the lens unit 51 are left, as in the case of FIG. 8.

Meanwhile, on the surface of the rigid substrate 53, a solder resist (SR) serving as an insulation film protecting the circuit pattern, for example, is provided. However, as described with reference to FIGS. 5 to 11, in the case of attaching the flexible substrate 54 to the surface of the rigid substrate 53 so as to be electrically connected with each other, the SR must be removed beforehand in a portion of the surface of the rigid substrate 53, in order to connect a connection terminal of the flexible substrate 54 and a connection terminal of the rigid substrate 53 with each other.

Figure 12:
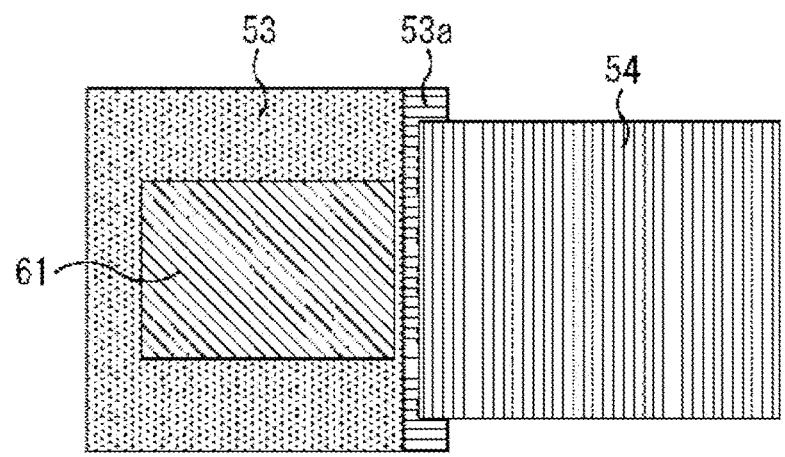
FIG. 12 is a plan view of the camera module illustrated in FIGS. 5A and 5B, seen from the upper direction of FIGS. 5A and 5B.

FIG. 12 is a plan view of the camera module 50 illustrated in FIGS. 5A and 5B, viewed from the upper direction of FIGS. 5A and 5B. It should be noted that in FIG. 12, the lens unit 51 and the frame 52 are not illustrated for easy understanding.

As illustrated in FIG. 12, the rectangle image sensor 61 is disposed on the almost center of the rigid substrate 53. As illustrated in the figure, a portion on the left side, in the figure, of the flexible substrate 54 overlaps a portion on the right side, in the figure, of the rigid substrate 53. In a portion on the right side, in the figure, of the rigid substrate 53, the SR is removed and a connection terminal portion 53a is formed.

Further, even in the flexible substrate 54, a connection terminal portion is formed in a portion on the left side in the figure. However, in FIG. 12, as a connection terminal portion is provided on the rear face of the flexible substrate 54, it is not illustrated.

The connection terminal portion 53a of the rigid substrate 53 and the connection terminal portion, not illustrated, of the flexible substrate 54 are provided with connection terminals, respectively, and the connection terminal of the rigid substrate 53 of the rigid substrate 53 and the connection terminal of the flexible substrate 54 are attached, whereby the rigid substrate 53 and the flexible substrate 54 are connected electrically.

Figure 13:
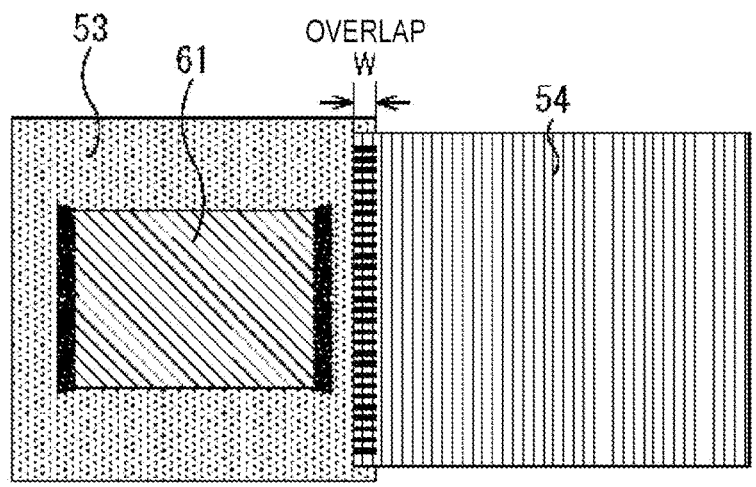
FIG. 13 is a plan view illustrating a configuration of a flexible substrate and a rigid substrate, illustrated in FIG. 12, in detail.
Figure 14:
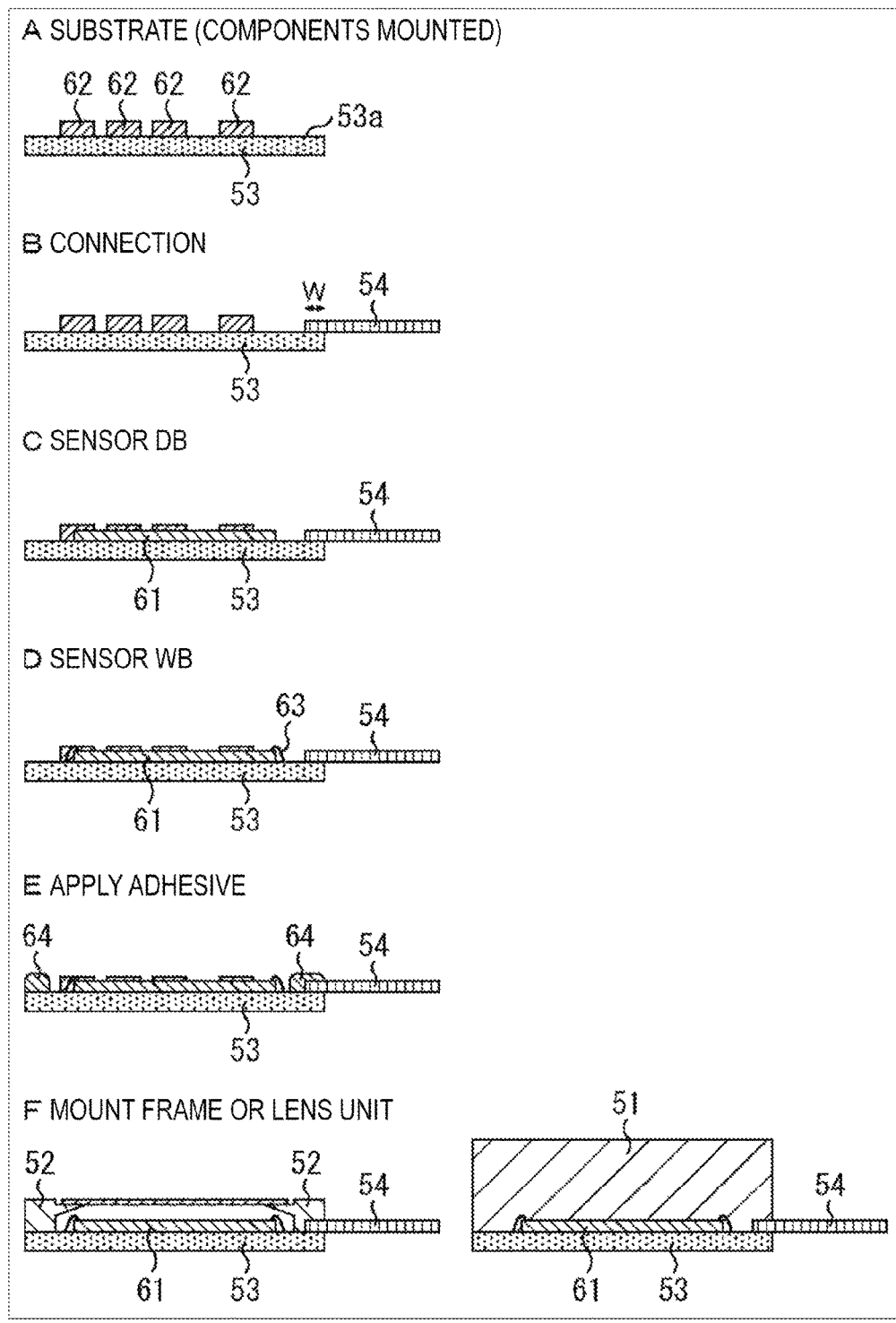
FIGS. 14A to 14F are diagrams illustrating an exemplary manufacturing process of a camera module to which the present technology is applied.

FIG. 13 is a plan view illustrating the configuration of the flexible substrate 54 and the rigid substrate 53 illustrated in FIG. 12, in detail. In the example of the figure, the image sensor 61 is illustrated in more detail. Further, a portion on the left side, in the figure, of the flexible substrate 54 overlaps a portion on the right side, in the figure, of the rigid substrate 53. In FIG. 13, the overlapped portion is illustrated as an overlap width W.

The overlap width W is represented as a distance from an end portion of one side (e.g., a side on the right side in FIG. 13) of a square rigid substrate, and in the band region of the overlap width W, the flexible substrate 54 and the rigid substrate 53 are attached to each other in an overlapped manner. In order to reduce the cost of the entire camera module by preventing the connection (attachment) with the flexible substrate 54 from affecting the arrangement of the image sensor 61 and by reducing the area of the expensive flexible substrate, the overlap width W is desirably 2.4 mm or less, for example.

FIGS. 14A to 14F are diagrams explaining an example of a manufacturing process of a camera module to which the present technology is applied.

First, as illustrated in FIG. 14A, the rigid substrate 53, on which a component 62 is mounted, is prepared. It should be noted that as described with reference to FIG. 12, the SR is removed in a portion on the right side, in the figure, of the rigid substrate 53, and the connection terminal portion 53a is formed.

Next, as illustrated in FIG. 14B, the flexible substrate 54 is attached to the rigid substrate 53. In this step, the rigid substrate 53 and the flexible substrate 54 are attached to each other in the overlap width W, and the connection terminal disposed in the connection terminal portion 53a and the connection terminal of the flexible substrate 54 are attached to thereby be connected electrically.

It should be noted that for attaching the rigid substrate 53 and the flexible substrate 54, solder, an adhesive including solder, ACF, ACP, or the like is used.

Next, as illustrated in FIG. 14C, the image sensor 61 is die-bonded (DB) to the rigid substrate 53.

Then, as illustrated in FIG. 14D, wire-bonding (WB) is performed between the image sensor 61 and the rigid substrate 53. In FIG. 14D, a wire 63 is wire-bonded.

Next, as illustrated in FIG. 14E, an adhesive is applied. In FIG. 14E, an adhesive 64 is applied to both left and right sides of the rigid substrate 53. As the adhesive 64 used for adhesion between the rigid substrate 53 and the lens unit 51 (or adhesion between the rigid substrate 53 and the frame 52), resin which attenuates light is used. For example, black resin, resin containing filler, or the like is used as the adhesive 64.

Finally, as illustrated in FIG. 14F, the frame 52 or the lens unit 51 is attached to rigid substrate 53. It should be note that in the drawing on the left side of FIG. 14F, the frame 52 is attached to the rigid substrate 53, and in the drawing on the right side, the lens unit 51 is attached to the rigid substrate 53. Further, as described above, in order to allow the light condensed by the lens to form an image appropriately on the imaging surface of the image sensor, it is necessary that the parallel degree of the top surface of the lens unit 51 and the imaging surface of the image sensor 61 is 1.5 degrees or less.

The camera module to which the present technology is applied is manufactured through this manufacturing process.

Meanwhile, in the present technology, the flexible substrate 54 and the rigid substrate 53 are attached in the portion where a portion of the flexible substrate 54 overlaps a portion of the rigid substrate 53 (overlap width). As such, according to the usage conditions of the camera module, it may be desired to improve the break strength of the flexible substrate 54.

Figure 15:
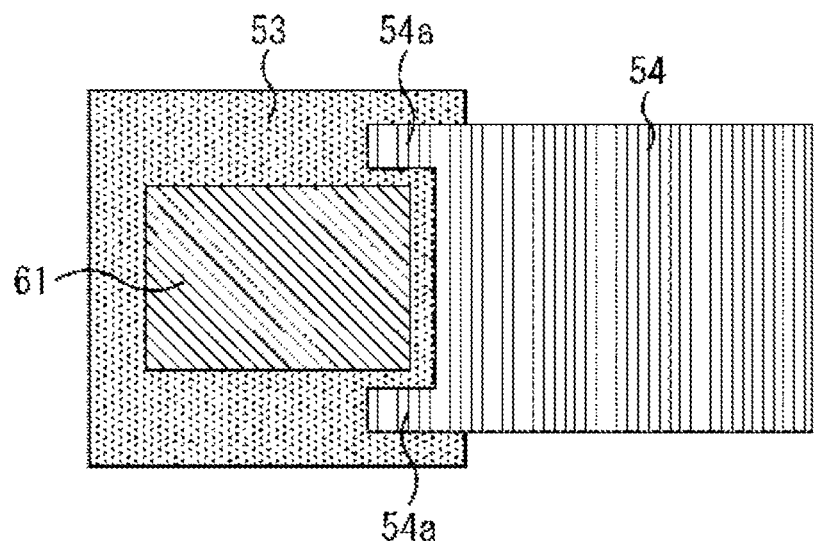
FIG. 15 is a diagram explaining another configuration of a flexible substrate in a camera module to which the present technology is applied.

FIG. 15 is a diagram explaining another configuration of the flexible substrate 54 in the camera module to which the present technology is applied. This figure is a diagram corresponding to FIG. 6, and parts corresponding to those of FIG. 6 are denoted by the same reference signs.

In the example of FIG. 15, a reinforced portion 54a is provided to the flexible substrate 54. In this example, the reinforced portions 54a, extending in a left direction in the figure, are provided to an end on the upper side and an end on the lower side, in the figure, of the flexible substrate 54. This means that in the flexible substrate 54, the reinforced portions 54a, extending in parallel with two sides of the square image sensor 61, are provided.

In addition to the overlap width described above, if the flexible substrate 54 and the rigid substrate 53 are also attached to each other in the reinforced portions 54a, the area of the attached surface increases, compared with the case of FIG. 6. Accordingly, in the case of the configuration of FIG. 15, it is possible to improve the break strength of the flexible substrate 54, compared with the case of FIG. 6.

Further, as the reinforced portions 54a are provided at positions where they are not brought into contact with the image sensor 61, they do not affect the arrangement of the image sensor 61.

By configuring the flexible substrate 54 as illustrated in FIG. 15, it is possible to improve the break strength of the flexible substrate 54 according to the usage conditions of the camera module, for example.

Figure 16:
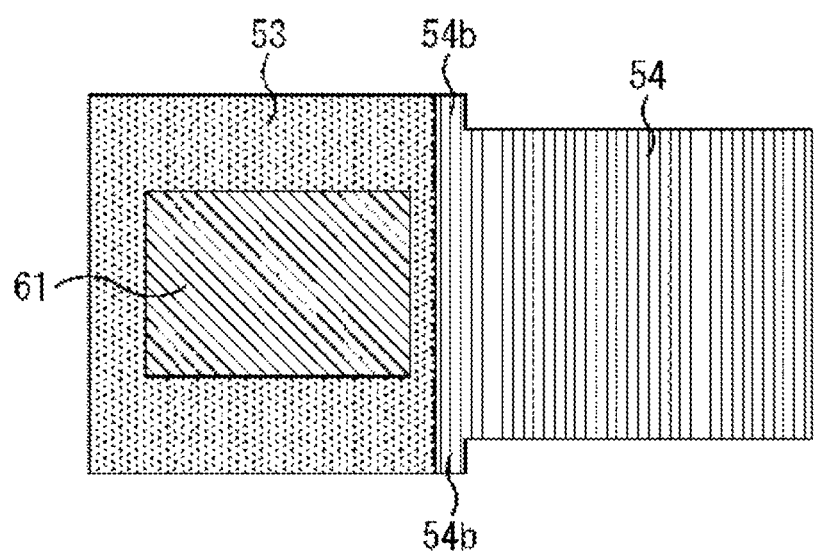
FIG. 16 is a diagram explaining still another configuration of a flexible substrate in a camera module to which the present technology is applied.

Alternatively, the flexible substrate 54 in the camera module to which the present technology is applied may be configured as illustrated in FIG. 16. This figure is a diagram corresponding to FIG. 6, and the parts corresponding to those of FIG. 6 are denoted by the same reference signs.

In the example of FIG. 16, a reinforced portion 54b is provided to the flexible substrate 54. In this example, the reinforced portions 54b, extending in an up and down direction in the figure, are provided to an end portion on the upper side and an end portion on the lower side, in the figure, of the flexible substrate 54. This means that in the flexible substrate 54, the reinforced portions 54b, extending in parallel with one side of the square image sensor 61, are provided.

In addition to the overlap width described above, if the flexible substrate 54 and the rigid substrate 53 are attached to each other in the reinforced portions 54b, the area of the attached surface increases, compared with the case of FIG. 6. Accordingly, in the case of the configuration of FIG. 16, it is possible to improve the break strength of the flexible substrate 54, compared with the case of FIG. 6.

Further, as the reinforced portions 54b are provided at positions where they are not brought into contact with the image sensor 61, they do not affect the arrangement of the image sensor 61.

By configuring the flexible substrate 54 as illustrated in FIG. 16, it is possible to improve the break strength of the flexible substrate 54 according to the usage conditions of the camera module, for example.

Meanwhile, in the embodiment described above, description has been given on the premise that the image sensor 61 and the rigid substrate 53 are wire-bonded, as described with reference to FIG. 14D.

The wire connected with the image sensor 61 bonded on the rigid substrate 53 is electrically connected with the connection terminal disposed on the connection terminal portion 53a through the wiring formed on the rigid substrate 53. Then, the connection terminal of the rigid substrate 53 and the connection terminal of the flexible substrate 54 are attached to each other, whereby the image sensor 61 and the flexible substrate 54 are connected electrically.

However, in the case of such a connection, there is a limitation in size reduction of the camera module. This means that when attaching the flexible substrate 54 to the rigid substrate 53, an overlap width is required as described above, and further, a width for wire bonding is also required between the image sensor 61 and the rigid substrate 53. Accordingly, the rigid substrate 53 is required to be larger by the width for at least the overlap width and the wire bonding, compared with the image sensor 61.

Figure 17:
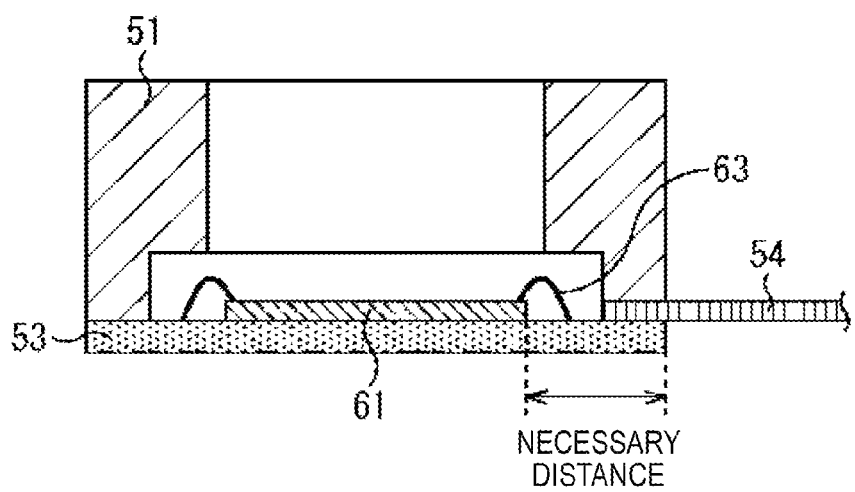
FIG. 17 is a side view explaining a necessary distance which is a distance from an end of an image sensor to an end of a rigid substrate.

FIG. 17 is a side view explaining a necessary distance which is a distance from an end of the image sensor 61 to an end of the rigid substrate 53. As illustrated in FIG. 17, a necessary distance is a distance corresponding to an overlap width and a width for wire bonding from an end of the rigid substrate 53. It should be noted that in practice, a distance considering tolerance and mounting accuracy for preventing an overlap between a wire-bonding pad of the rigid substrate 53 and the connection terminal portion 53a, in addition to the overlap width and the width for wire bonding, serves as a necessary distance.

Figure 18:
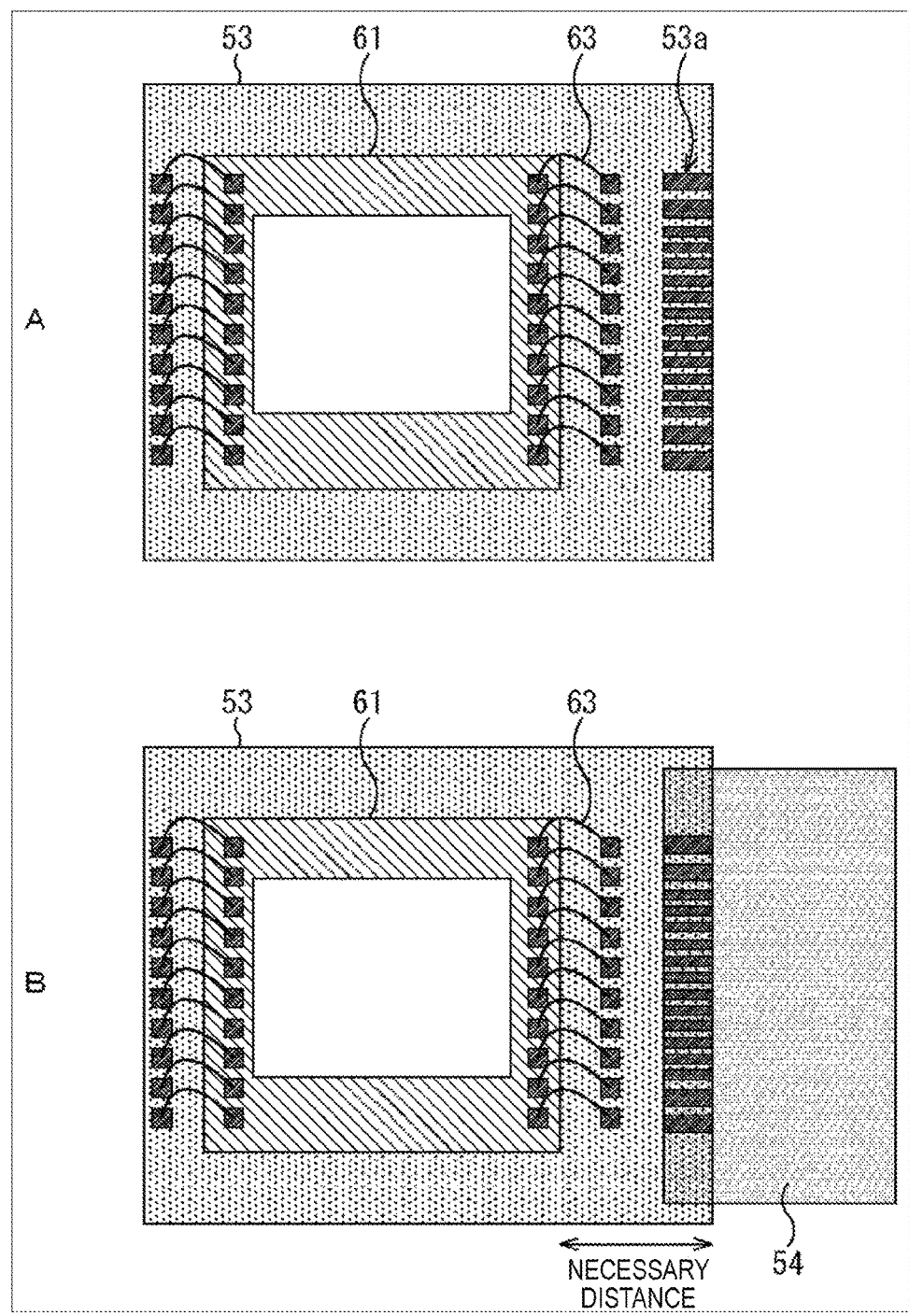
FIGS. 18A and 18B are plan views seen from above of FIG. 17.

FIGS. 18A and 18B are plan views seen from above of FIG. 17. In the figure, illustration of the lens unit 51 is omitted for easy understanding.

As illustrated in FIG. 18A, one end of a wire 63 is connected with each of electrode pads (squares in the figure) provided by being aligned in a vertical direction on the right side in the figure and on the left side in the figure of the image sensor 61. Further, the other end of the wire 63 is connected with each of the electrode pads (squares in the figure) provided by being aligned in a vertical direction on the right side in the figure and on the left side in the figure of the rigid substrate 53.

The electrode pads of the rigid substrate 53 are connected with the connection terminal portions 53a through the wiring formed in the rigid substrate 53, respectively.

Then, as illustrated in FIG. 18B, the flexible substrate 54 is attached, in an overlapped manner, to the connection terminal portions 53a of the rigid substrate 53. At this time, a distance from the end on the right side, in the figure, of the image sensor 61 to the end on the left side, in the figure, of the flexible substrate 54 is a necessary distance.

If the rigid substrate 53 is designed so as to have such a necessary distance, it is difficult to reduce the size of the rigid substrate 53. Consequently, further reduction in size of the camera module is difficult.

Figure 19:
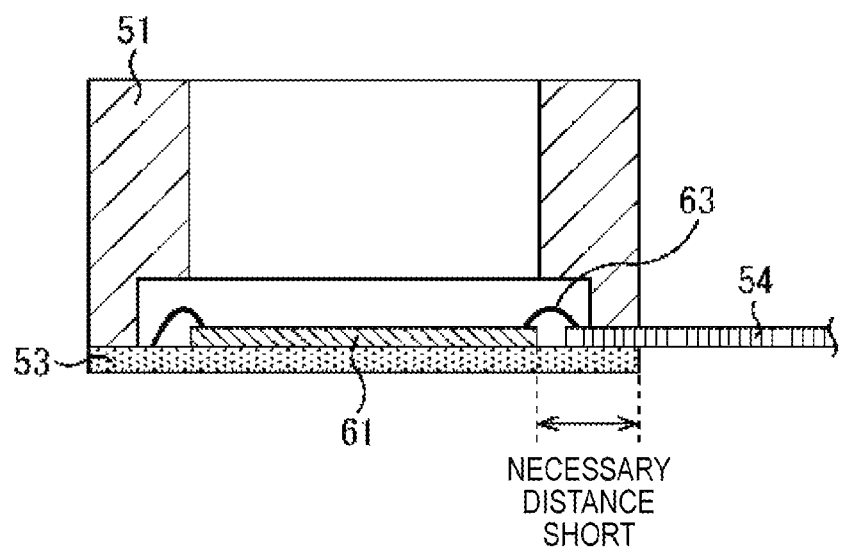
FIG. 19 is a diagram illustrating an example in which an electrode pad of an image sensor and a flexible substrate are directly connected with each other.

As such, as illustrated in FIG. 19, it is acceptable that the other end of the wire 63, connected with the electrode pad of the image sensor 61, is directly connected with the flexible substrate 54, for example. In the case of the connection as illustrated in FIG. 19, as the width for wire bonding can be reduced significantly, the necessary distance can be shortened compared with the case of FIG. 17, for example.

In the case where the other end of the wire 63, connected with the electrode pad of the image sensor 61, is directly connected with the flexible substrate 54, an electrode pad may be formed by forming an opening by punching a portion of an end portion of the flexible substrate 54 on which wiring is not formed, and embedding metal or the like in the opening, for example.

Figure 20:
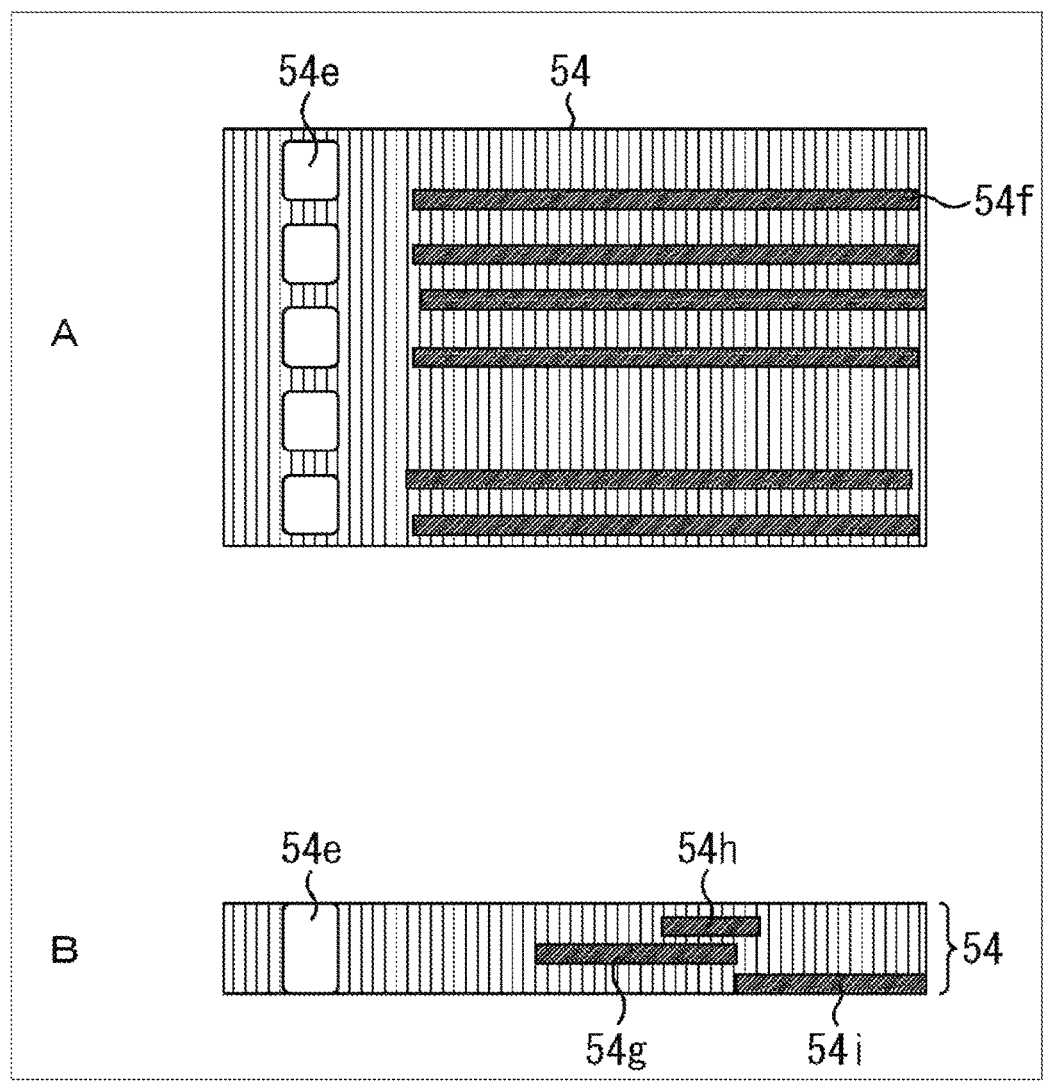
FIGS. 20A and 20B are diagrams explaining punching of a flexible substrate.

FIGS. 20A and 20B are diagrams explaining punching of the flexible substrate 54.

FIG. 20A is a plan view illustrating an example of punching of the flexible substrate 54. In this example, an end portion on the left side, in the figure, of the flexible substrate 54 is punched to thereby form openings 54e aligned in a vertical direction. As illustrated in the figure, the openings 54e are formed at positions on the surface of the flexible substrate 54 where wiring 54f is not formed.

It should be noted that the flexible substrate 54 has a multilayer structure, and is formed such that four layers of substrates are layered. Further, on the uppermost substrate of the flexible substrate 54, wiring is not formed. In FIG. 20A, a plurality of lines extending in a horizontal direction in the figure schematically represent that the wiring 54f formed in the flexible substrate 54 is seen through the uppermost substrate.

FIG. 20B is a side view corresponding to FIG. 20A. As illustrated in the figure, the opening 54e is formed so as to penetrate from the surface to the bottom face of the flexible substrate 54, and is formed at a position where wiring 54g, wiring 54h, or wiring 54i is not formed inside the flexible substrate 54. This means that all of the layers of the flexible substrate 54 having a multilayer structure are punched to thereby form the opening 54e.

In the opening 54e, metal is embedded. The metal to be embedded here is Au or a metal having high connectivity with the electrode pad of the image sensor 61, for example. Further, if the thickness of the flexible substrate 54 is about 100 μm, metal to be embedded may be one in which the surface of a metal such as Ni is plated by Au, for example, rather than a single metal.

Figure 21:
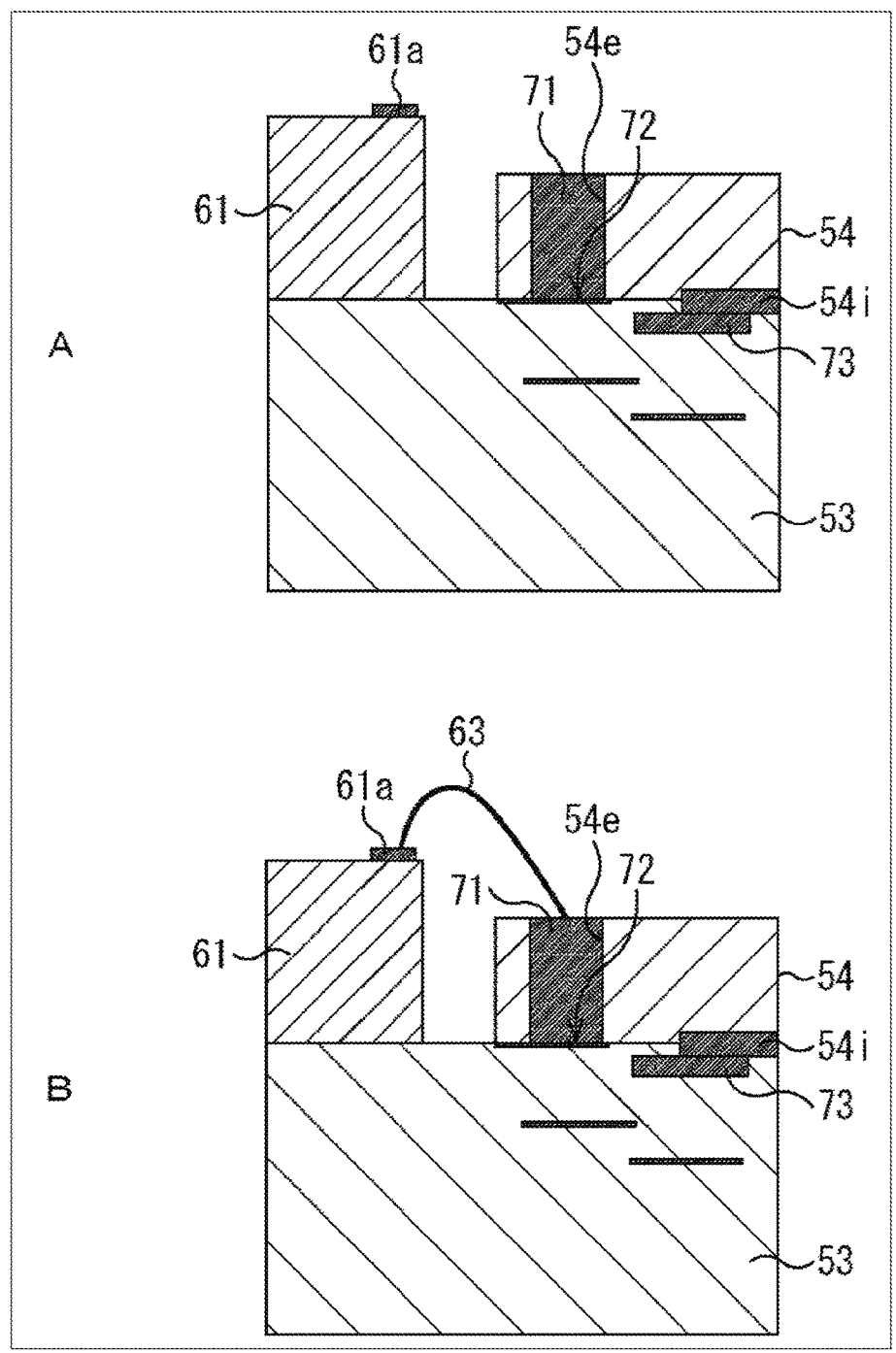
FIGS. 21A and 21B are side views explaining a method of connecting a rigid substrate and a flexible substrate.

FIGS. 21A and 21B are side views explaining a connecting method between the rigid substrate 53 and the flexible substrate 54.

As illustrated in FIG. 21A, metal is embedded in the opening 54e to thereby form an embedded electrode 71. The embedding method may be a method such as a squeegee printing, for example. The embedded electrode 71 is connected with an electrode pad 72 of the rigid substrate 53 through metal bonding by heat or ultrasonic waves. This means that the embedded electrode 71 is directly welded to the electrode pad 72.

By directly welding the metals in this way, the bonding strength between the rigid substrate 53 and the flexible substrate 54 is enhanced.

The electrode pad 72 is electrically connected with wiring 73 inside the rigid substrate 53. The wiring 73 of the rigid substrate 53 is connected with the wiring 54i of the flexible substrate 54, and the rigid substrate 53 and the flexible substrate 54 are attached to each other with an adhesive such as ACF, an adhesive containing solder (SAM, or the like), or the like.

Here, the wiring 73 of the rigid substrate 53 corresponds to a terminal of the connection terminal portion 53a, for example, and the wiring 54i of the flexible substrate 54 corresponding to a terminal of a connection terminal portion of the flexible substrate 54, for example.

Then, as illustrated in FIG. 21B, the electrode pad 61a of the image sensor 61 and the embedded electrode 71 are connected with each other by wire bonding through the wire 63. Thereby, the electrode pad 61a of the image sensor 61 and the wiring 54i of the flexible substrate 54 are connected with each other electrically.

Figure 22:
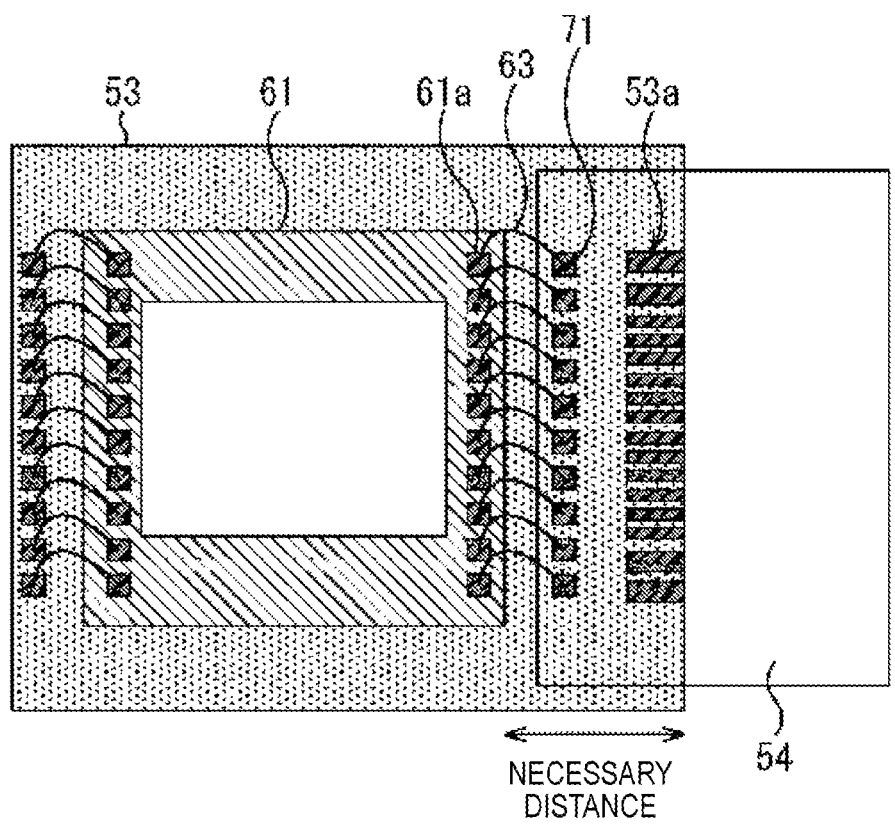
FIG. 22 is a plan view seen from above of FIGS. 21A and 21B.

FIG. 22 is a plan view seen from above of FIGS. 21A and 21B.

As illustrated in FIG. 22, one end of a wire is connected with each of the electrode pads provided by being aligned in a vertical direction on the right side in the figure and on the left side in the figure of the image sensor 61. The flexible substrate 54 is attached so as to overlap the connection terminal portions 53a of the rigid substrate 53, and the other end of the wire 63, connected with the electrode pad 61a on the right side in the figure, is connected with the embedded electrode 71 embedded in the flexible substrate 54. In this case, a distance from the end on the right side, in the figure, of the image sensor 61 to the end on the left side, in the figure, of the flexible substrate 54 is a necessary distance.

It should be noted that in FIG. 22, the electrode pads on the left side in the figure of the image sensor 61 are connected with the electrode pads of the rigid substrate 53 through wires.

With this configuration, as the width for wire bonding can be reduced significantly, the necessary distance can be shortened, compared with the case of FIGS. 18A and 18B, for example. Thereby, it is possible to further reduce the size of the camera module.

In the example described above with reference to FIGS. 21A and 21B, while description has been given on the example of the case where the embedded electrode 71 is embedded in the opening 54e of the flexible substrate 54 by a method such as squeegee printing, it is possible to form a stud bump, instead of embedding the embedded electrode 71.

Figure 23:
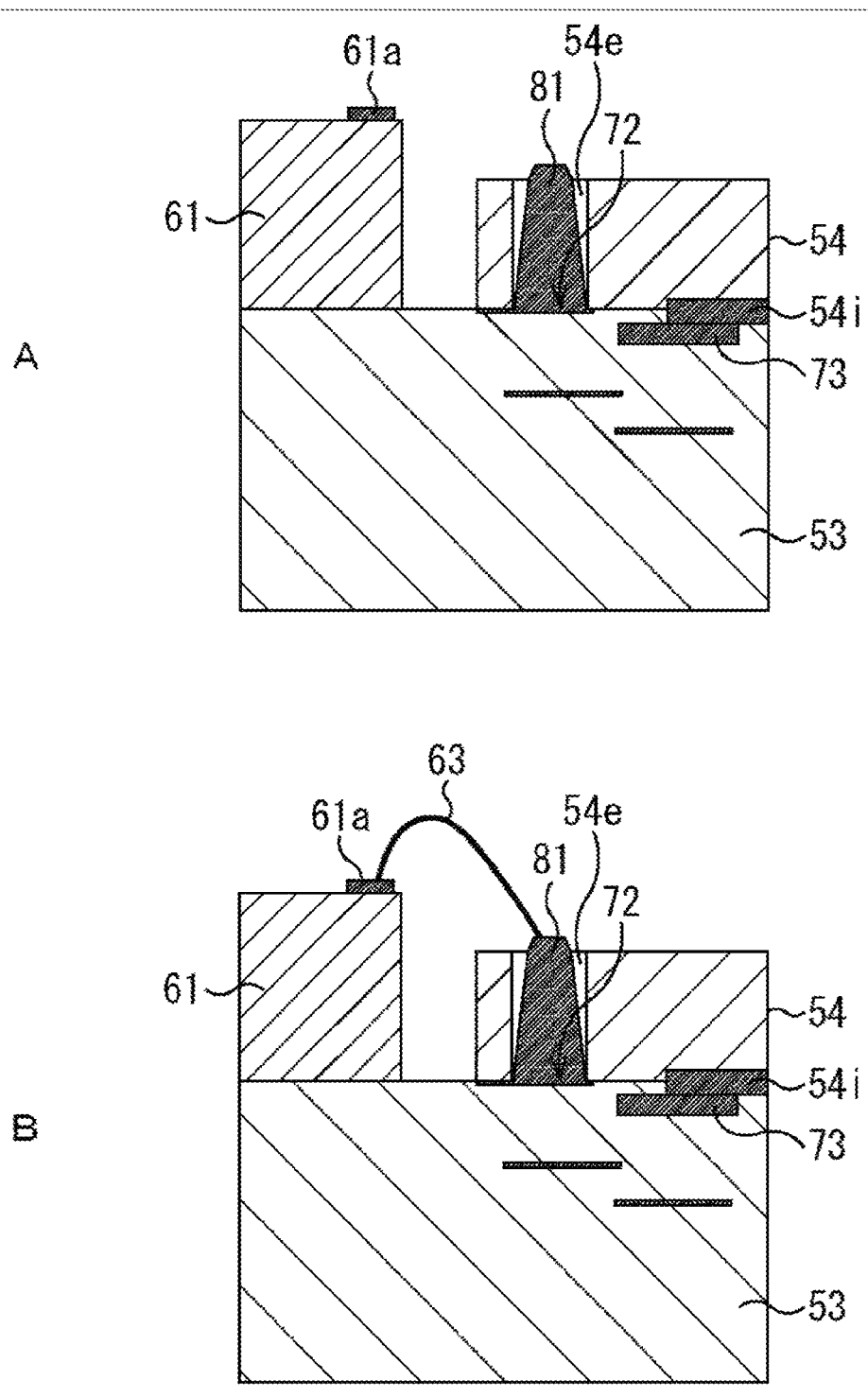
FIGS. 23A and 23B are side views explaining another example of a method of connecting a rigid substrate and a flexible substrate.

FIGS. 23A and 23B are side views explaining another example of a connecting method between the rigid substrate 53 and the flexible substrate 54.

As illustrated in FIG. 23A, a stud bump 81 is formed in the opening 54e. The stud bump 81 is connected with the electrode pad 72 of the rigid substrate 53 through metal bonding by heat or ultrasonic waves. This means that the stud bump 81 is directly welded to the electrode pad 72.

By directly welding the metals in this way, the bonding strength between the rigid substrate 53 and the flexible substrate 54 is enhanced.

The electrode pad 72 is electrically connected with the wiring 73 inside the rigid substrate 53. The wiring 73 of the rigid substrate 53 is connected with the wiring 54i of the flexible substrate 54, and the rigid substrate 53 and the flexible substrate 54 are attached to each other with an adhesive of ACF, for example.

Then, as illustrated in FIG. 23B, the electrode pad 61a of the image sensor 61 and the stud bump 81 are connected by wire bonding through the wire 63. Thereby, the electrode pad 61a of the image sensor 61 and the wiring 54i of the flexible substrate 54 are electrically connected.

It should be noted that after the stud bump 81 is formed, the rigid substrate 53 and the flexible substrate 54 may be overlapped and attached to each other by aligning the position of the stud bump 81 and the position of the opening 54e.

Meanwhile, in the embodiment described above with reference to FIGS. 21 to 23, the embedded electrode 71 or the stud bump 81 formed in the opening 54e of the flexible substrate 54 is connected with the electrode pad 72 of the rigid substrate 53, and is electrically connected with the wiring 73 inside the rigid substrate 53. In this case, a signal output from the image sensor 61 is transmitted from the flexible substrate 54 through the rigid substrate 53 once, and is transmitted to the flexible substrate 54 again.

However, if a signal output from the image sensor 61 is transmitted to the flexible substrate 54 and is directly transmitted inside the flexible substrate 54, the wiring in the rigid substrate 53 can be further simplified. Further, as a signal output from the image sensor 61 is transmitted not through the connection terminal portion 53a of the rigid substrate 53, it is possible to reduce impedance associated with connection of the terminals, and further, to reduce the number of terminals in the connection terminal portions 53a.

Figure 24:
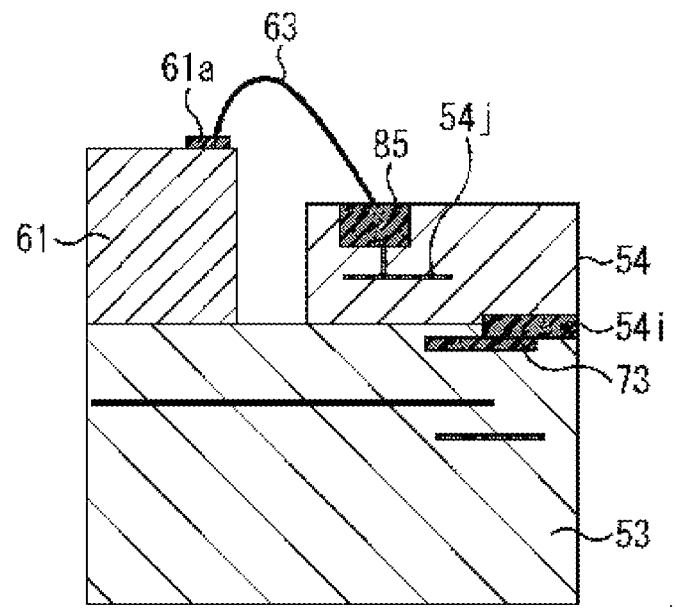
FIG. 24 is a side view explaining still another example of a method of connecting a rigid substrate and a flexible substrate.

FIG. 24 is a side view explaining still another example of a connecting method between the rigid substrate 53 and the flexible substrate 54.

In the example of FIG. 24, a pad 85 is formed on the upper side in the figure of the flexible substrate 54. The pad 85 is wire-bonded to the electrode pad 61a of the image sensor 61 through the wire 63, and a signal output from the image sensor 61 is transmitted inside the flexible substrate 54 through the wiring 54j and the like.

Figure 25:
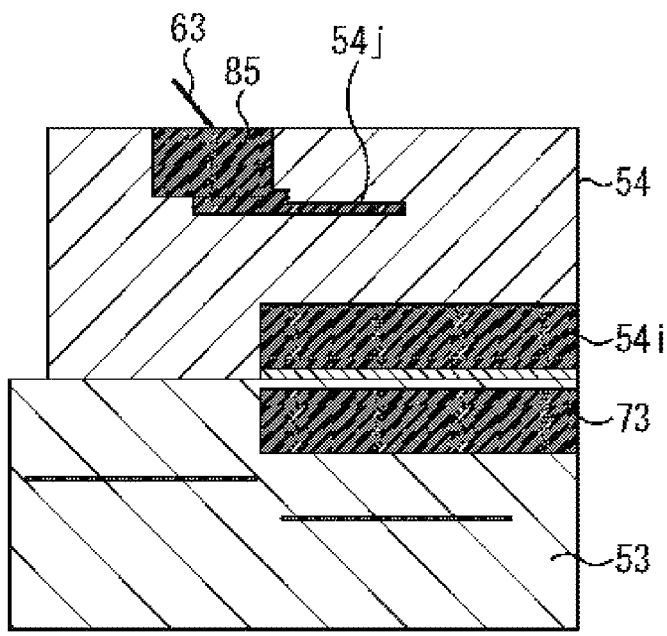
FIG. 25 is a diagram illustrating an enlarged connecting portion between the flexible substrate and the rigid substrate of FIG. 24.

FIG. 25, which is part of FIG. 24, is a diagram illustrating an enlarged connecting portion between the flexible substrate 54 and the rigid substrate 53.

As illustrated in FIG. 25, a signal supplied through the wire 63 connected with the pad 85 is transmitted inside the flexible substrate 54 through the wiring 54j and the like, not through the rigid substrate 53. On the other hand, a signal transmitted through the wiring and the like in the rigid substrate 53 is transmitted to the flexible substrate 54, by the wiring 73 (terminal of the connection terminal portion 53a) of the rigid substrate 53 and the wiring 54i (terminal of the connection terminal portion) of the flexible substrate being connected with each other with ACF, an adhesive containing solder, or the like.

As illustrated in FIG. 25, in the case of forming the pad 85, in the flexible substrate 54 having a multilayer structure, the pad 85 may be formed by forming an opening by punching an end portion of the uppermost layer, and embedding metal in the opening, for example. In this step, metal is embedded in the opening by squeegee printing or the like.

Figure 26:
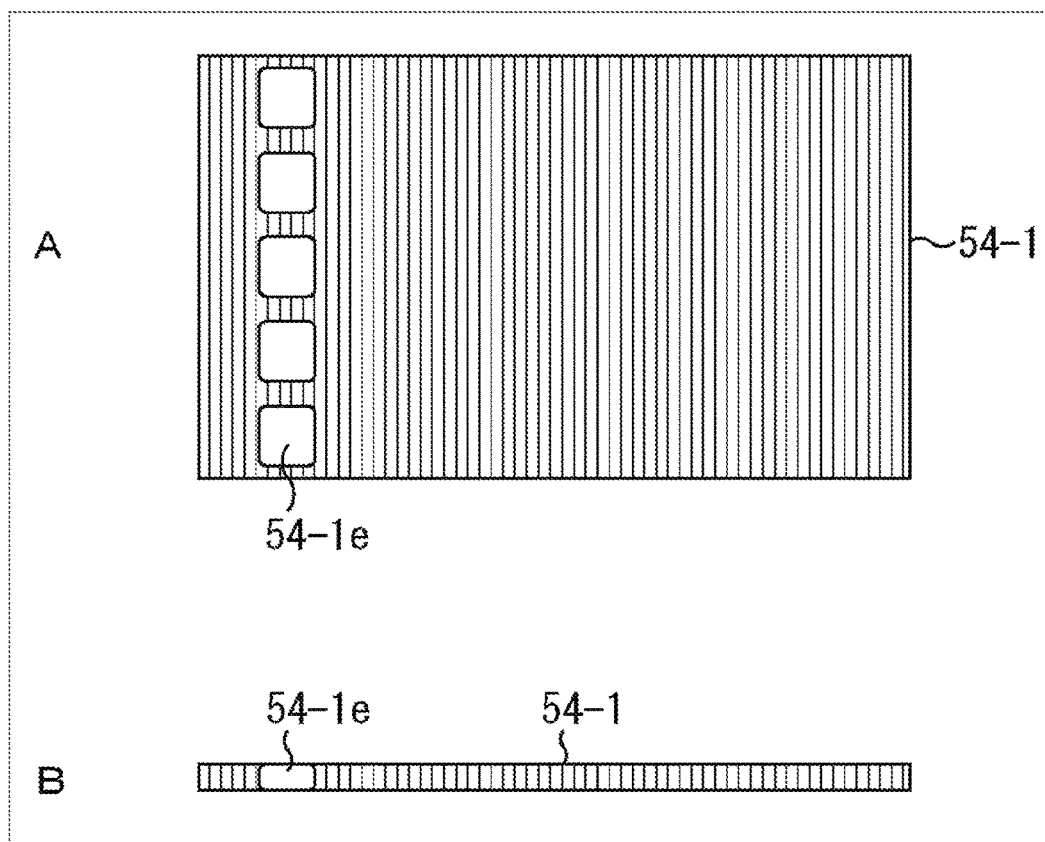
FIGS. 26A and 26B are diagrams explaining punching of the uppermost layer of a flexible substrate.

FIGS. 26A and 26B are diagrams explaining punching of the flexible substrate 54 when forming the pad 85 illustrated in FIG. 25.

FIG. 26A is a plan view illustrating an example of punching of the flexible substrate 54. In this example, an end portion on the left side, in the figure, of an uppermost layer 54-1 of the flexible substrate 54 is punched to thereby form openings 54-1e aligned in a vertical direction.

FIG. 26B is a side view corresponding to FIG. 26A. As illustrated in the figure, the opening 54-1e is formed so as to penetrate only the uppermost layer 54-1 of the flexible substrate 54.

Figure 27:
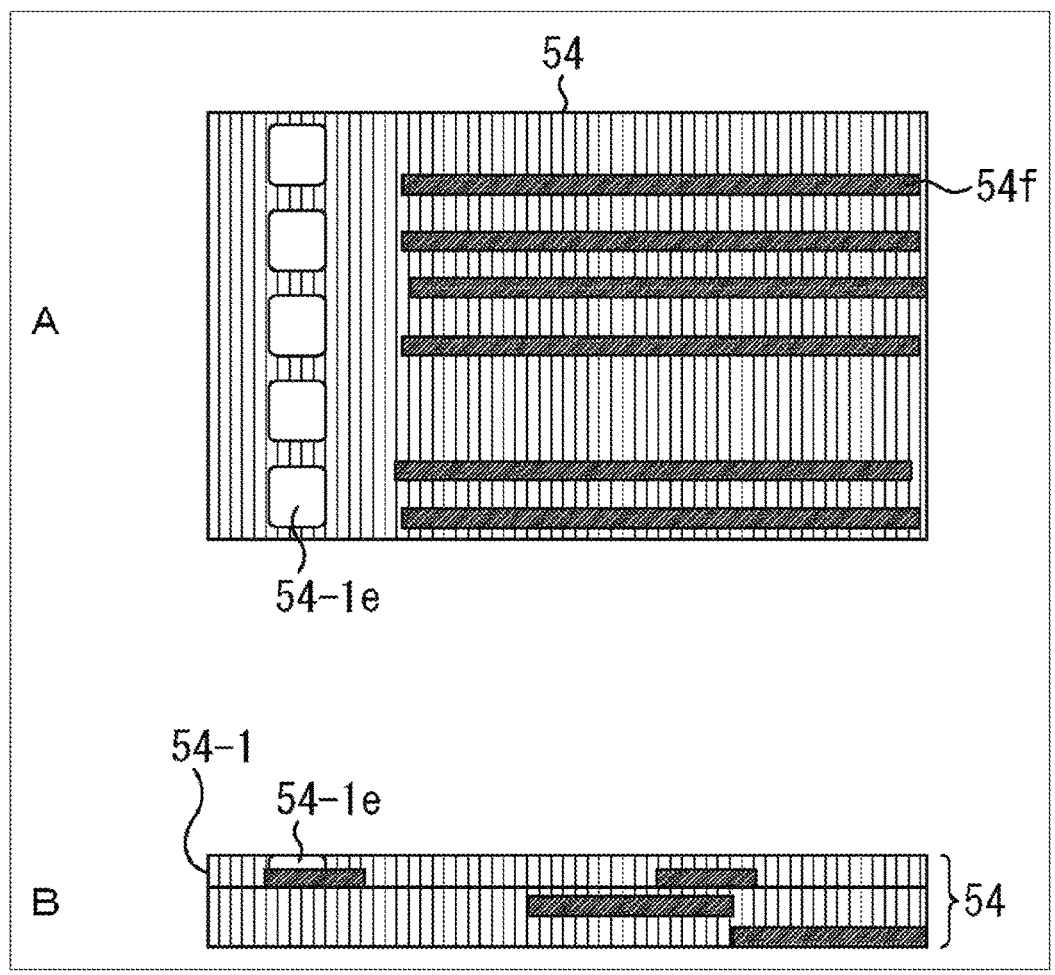
FIGS. 27A and 27B are diagrams explaining a configuration of the entire flexible substrate configured by including the uppermost layer illustrated in FIGS. 26A and 26B.

FIGS. 27A and 27B are diagrams illustrating a configuration of the entire flexible substrate 54 configured to include the uppermost layer 54-1 illustrated in FIG. 26A and FIG. 26B.

FIG. 27A is a plan view of the entire flexible substrate 54 configured to include the uppermost layer 54-1. In this example, the flexible substrate 54 has a four-layer structure. In FIG. 27A, the uppermost layer 54-1 adheres to the other three layers, and a plurality of lines extending in a horizontal direction in the figure schematically represent that the wiring 54f formed in the flexible substrate 54 is seen through the uppermost substrate.

FIG. 27B is a side view corresponding to FIG. 27A. As illustrated in the figure, the opening 54-1e only penetrates the uppermost layer 54-1 of the flexible substrate 54, and no opening is formed in the lower layers.

With this configuration, as the width for wire bonding can be reduced significantly, the necessary distance can be shortened compared with the case of FIGS. 18A and 18B, for example. Thereby, it is possible to further reduce the size of the camera module.

Further, as a signal output from the image sensor 61 is transmitted to the flexible substrate 54 and is directly transmitted inside the flexible substrate 54, the wiring in the rigid substrate 53 can be further simplified.

Further, as a signal output from the image sensor 61 is transmitted not through the connection terminal portion 53a of the rigid substrate 53, it is possible to reduce impedance associated with connection of the terminal, and further, to reduce the number of terminals in the connection terminal portion 53a.

Alternatively, in the flexible substrate 54, the pad 85 as illustrated in FIG. 25 and the embedded electrode 71 as illustrated in FIGS. 21A and 21B (or the stud bump 81 as illustrated in FIGS. 23A and 23B) may be formed so as to be provided together.

As described above, in the flexible substrate 54, if the pad 85 is formed, impedance associated with connection of the terminal can be reduced. On the other hand, in order to improve bonding strength between the rigid substrate 53 and the flexible substrate 54, it is effective to form the embedded electrode 71 or the stud bump 81.

For example, a wire for a signal having high resistance to noise, among the signals transmitted from and received by the image sensor 61, is allowed to be connected with the embedded electrode 71 or the stud bump 81, and the other wires for a signal are allowed to be connected to the pad 85, for example. In this way, if the pad 85 and the embedded electrode 71 (or stud bump 81) are provided together, it is possible to improve the bonding strength between the rigid substrate 53 and the flexible substrate 54 without lowering the SI (Signal Integrity).

In the example described above with reference to FIGS. 24 to 27, description has been given on the example in which an opening is formed in the flexible substrate 54, whereby the embedded electrode 71, the stud bump 81, or the pad 85 is formed and wire-bonding is performed. However, it is also acceptable to perform wire bonding to the electrode pad provided on the surface of the uppermost layer 54-1 of the flexible substrate 54, without forming an opening in the flexible substrate 54.

Further, when performing wire bonding to the electrode pad provided on the surface of the uppermost layer 54-1 of the flexible substrate 54, a form of on bump bonding (ball stitch on ball bonding) may be taken. On bump bonding is a form in which a bump is formed on an electrode pad in advance, and second bonding is performed on the bump.

Meanwhile, the embodiment described above with reference to FIGS. 19 to 27 has described an example in which the other end of the wire 63, connected with the electrode pad of the image sensor 61, is directly connected with the flexible substrate 54, whereby the size of the camera module is reduced.

However, it is also possible to reduce the size of the camera module by adopting another method. For example, it is possible to reduce the size of the camera module by making the electrode pads aligned in a vertical direction of the rigid substrate 53 and the terminals of the connection terminal portion 53a of the rigid substrate 53 common.

As described with reference to FIG. 18A, one end of the wire 63 is connected with each of the electrode pads (squares in the figure) provided to be aligned in a vertical direction on the right side in the figure and on the left side in the figure of the image sensor 61. Further, the other end of the wire 63 is connected with each of the electrode pads (squares in the figure) provided to be aligned in a vertical direction on the right side in the figure and on the left side in the figure of the rigid substrate 53. Here, each of the electrode pads provided to be aligned on the right side, in the figure, of the rigid substrate is an electrode pad 53b.

Figure 28:
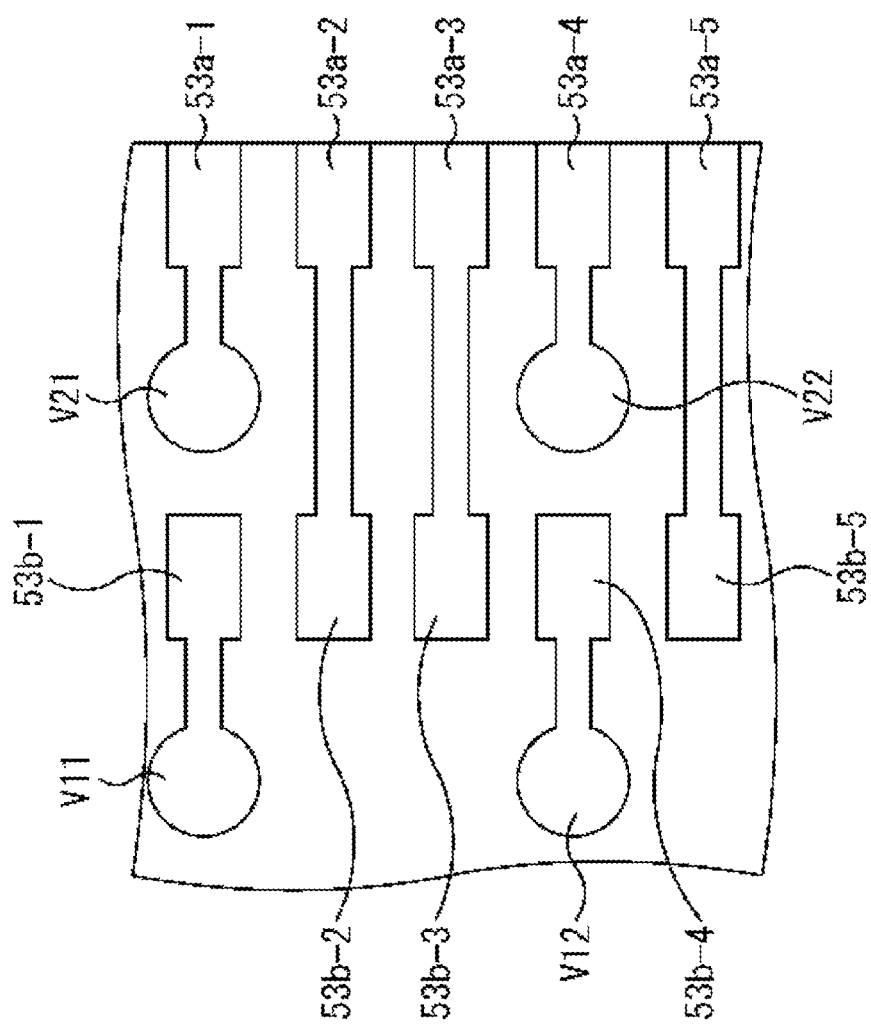
FIG. 28 is an enlarged view of part of electrode pads and a connection terminal portion in FIG. 18A.

FIG. 28 is an enlarged view of part of the electrode pads 53b and the connection terminal portion 53a in FIG. 18A. FIG. 28 illustrates electrode pads 53b-1 to 53b-5, and terminals 53a-1 to 53a-5 in the connection terminal portion 53a.

The electrode pad 53b-1 is connected with the wiring inside (in the lower layer of) the rigid substrate 53 through a via V11, and is connected with a via, not shown, through the wiring, to thereby be electrically connected with a terminal connected with the via. Further, the terminal 53a-1 is connected with the wiring inside (in the lower layer of) the rigid substrate 53 through a via V21, and is connected with an electrode pad or the like, not shown, through the wiring.

The electrode pad 53b-2 is directly connected with the terminal 53a-2 through the wiring in the surface layer of the rigid substrate 53 to thereby be electrically connected with the terminal 53a-2.

The electrode pad 53b-3 is directly connected with the terminal 53a-3 through the wiring in the surface layer of the rigid substrate 53 to thereby be electrically connected with the terminal 53a-3.

The electrode pad 53b-4 is connected with the wiring inside (in the lower layer of) the rigid substrate 53 through a via V12, and is connected with a via, not shown, through the wiring, to thereby be electrically connected with a terminal connected with the via. Further, the terminal 53a-4 is connected with the wiring inside (in the lower layer of) the rigid substrate 53 through a via V22, and is connected with an electrode pad or the like, not shown, through the wiring.

The electrode pad 53b-5 is directly connected with the terminal 53a-3 through the wiring in the surface layer of the rigid substrate 53 to thereby be electrically connected with the terminal 53a-5.

In this way, by passing through the wiring inside (in the lower layer of) the rigid substrate 53 or the wiring in the surface layer of the rigid substrate 53, a distance between the electrode pad 53b and the connection terminal portion 53a must be longer. Accordingly, a necessary distance, which is a distance corresponding to the overlap width and the width for wire bonding, from an end of the rigid substrate 53, also becomes longer.

Figure 29:
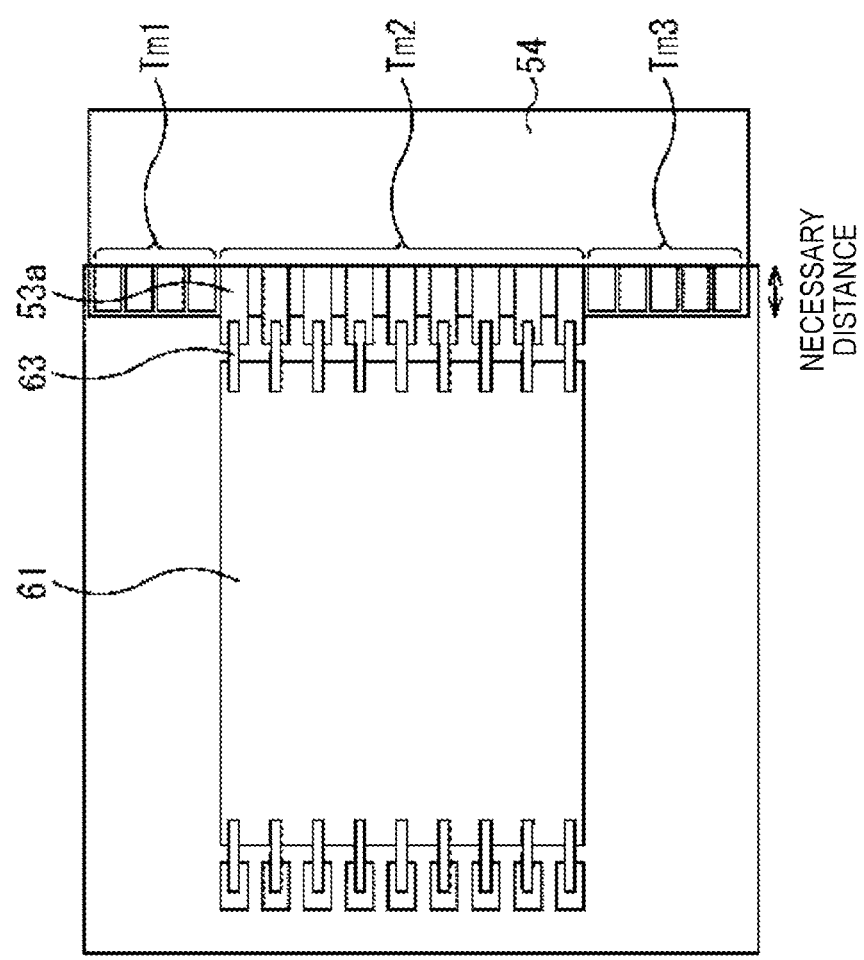
FIG. 29 is a diagram illustrating an example in which an electrode pad of a rigid substrate and a terminal of a connection terminal unit are made common.

As such, as illustrated in FIG. 29, the electrode pads provided to be aligned in a vertical direction of the rigid substrate 53 and the terminals in the connection terminal portion 53a are made common, for example. In the example of FIG. 29, the electrode pads provided at positions near the connection terminal portion 53a and aligned in a vertical direction on the right side, in the figure, of the rigid substrate 53, are made common to the terminals in the connection terminal portion 53a.

It should be noted that in FIG. 29, the terminals in the connection terminal portion 53a are classified into three, in which a terminal group provided on the upper side in the figure is a terminal group Tm1, a terminal group provided in the middle in the figure is a terminal group Tm2, and a terminal group provided on the lower side in the figure is a terminal group Tm3. Among the terminal groups Tm1 to Tm3, a terminal group which is made common to the electrode pads provided to be aligned in a vertical direction on the right side in the figure of the rigid substrate 53 is the terminal group Tm2. The terminal group Tm1 and the terminal group Tm3 are not made common to the electrode pads provided to be aligned in a vertical direction on the right side in the figure of the rigid substrate 53.

Figure 30:
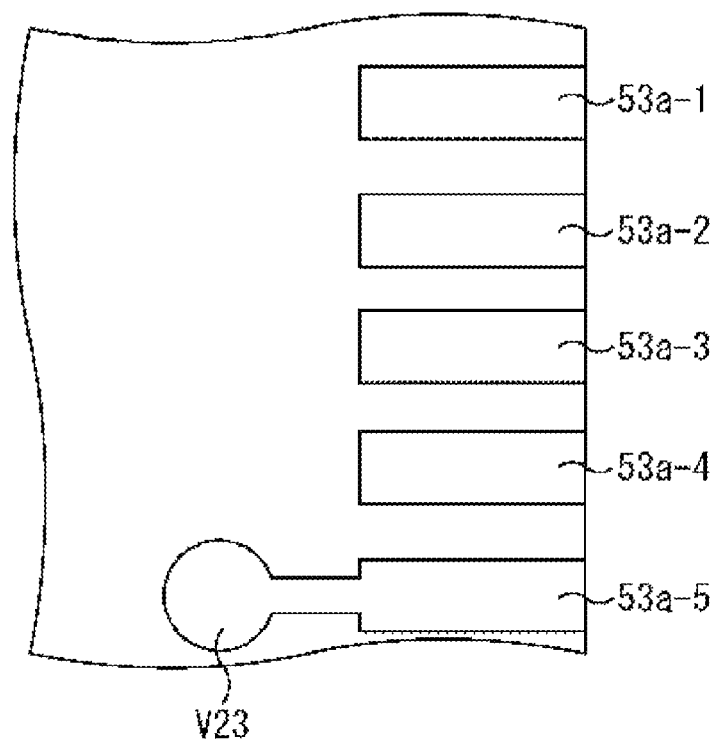
FIG. 30 is an enlarged view of part of a terminal group of FIG. 29.

FIG. 30 is an enlarged view of part of the terminal group Tm2 in FIG. 29. FIG. 30 illustrates the terminals 53a-1 to 53a-5 in the connection terminal portion 53a.

The terminals 53a-1 to 53a-5 in FIG. 30 are terminals having larger areas compared with the case of the terminals 53a-1 to 53a-5 in FIG. 28. To each of the terminals 53a-1 to 53a-5, the other end of the wire 63, in which one end thereof is connected with the electrode pad of the image sensor 61, is wire bonded. Further, to each of the terminals 53a-1 to 53a-5, a connection terminal of the flexible substrate 54 is attached.

Further, the terminal 53a-5 is configured to be connected with the wiring inside (in the lower layer of) the rigid substrate 53 through a via V23. The terminal 53a-5 is, for example, a terminal of a power source or GND, and is connected with the power source or the GND through the wiring inside (in the lower layer of) the rigid substrate 53.

Figure 31:
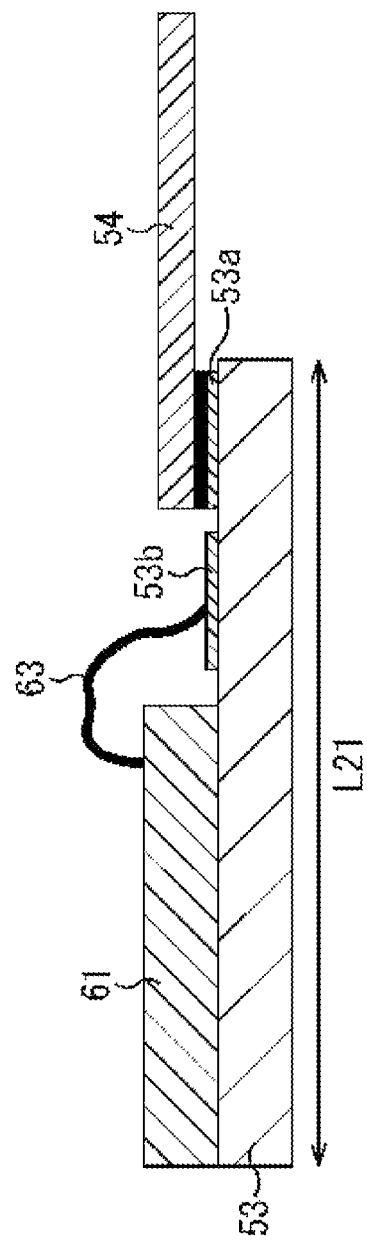
FIG. 31 is a cross-sectional view corresponding to FIG. 18B.

FIG. 31 is a cross-sectional view corresponding to FIG. 18B, and is a cross-sectional view taken along a line in a horizontal direction in the figure passing through the center of the image sensor 61 in FIG. 18B. As illustrated in the figure, one end of the wire 63 is connected with the electrode pad on the image sensor 61, and the other end of the wire 63 is connected with the electrode pad 53b of the rigid substrate 53.

Figure 32:
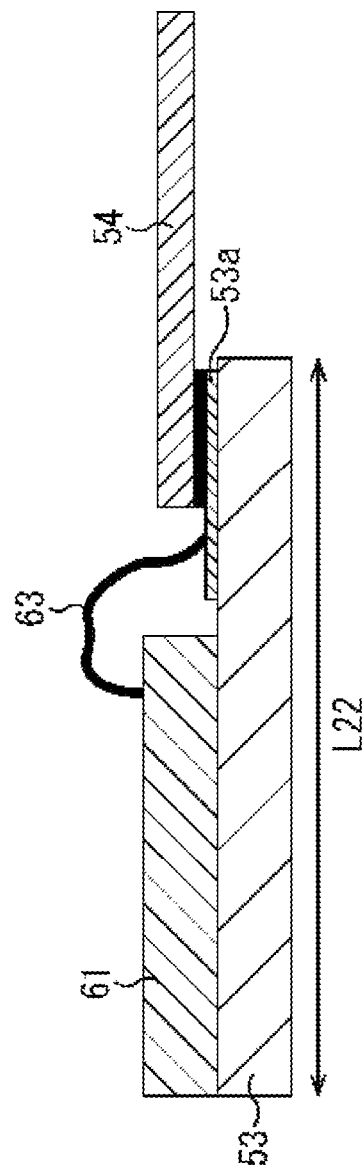
FIG. 32 is a cross-sectional view corresponding to FIG. 29.

FIG. 32 is a cross-sectional view corresponding to FIG. 29, and is a cross-sectional view taken along a line in a horizontal direction in the figure passing through the center of the image sensor 61 in FIG. 18B. As illustrated in the figure, one end of the wire 63 is connected with the electrode pad on the image sensor 61, and the other end of the wire 63 is connected with the terminal in the connection terminal portion 53a on the rigid substrate 53. Further, in the case of FIG. 32, the electrode pads (electrode pad 53b in FIG. 31) provided to be aligned on the right side in the figure of the rigid substrate 53 are made common to the terminals of the connection terminal portion 53a.

By adopting the configuration illustrated in FIG. 32, it is possible to shorten the length in a horizontal direction in the figure of the rigid substrate 53. This means that a length L22 in a horizontal direction in the figure of the rigid substrate 53, in the configuration illustrated in FIG. 32, is shorter than a length L21 in a horizontal direction in the figure of the rigid substrate 53 in the configuration illustrated in FIG. 31. As such, a necessary distance which is a distance from an end of the rigid substrate 53 corresponding to the overlap width and the width for wire bonding, can also be shortened.

In this way, according to the present technology, the size of a camera module can be further reduced.

Figure 33:
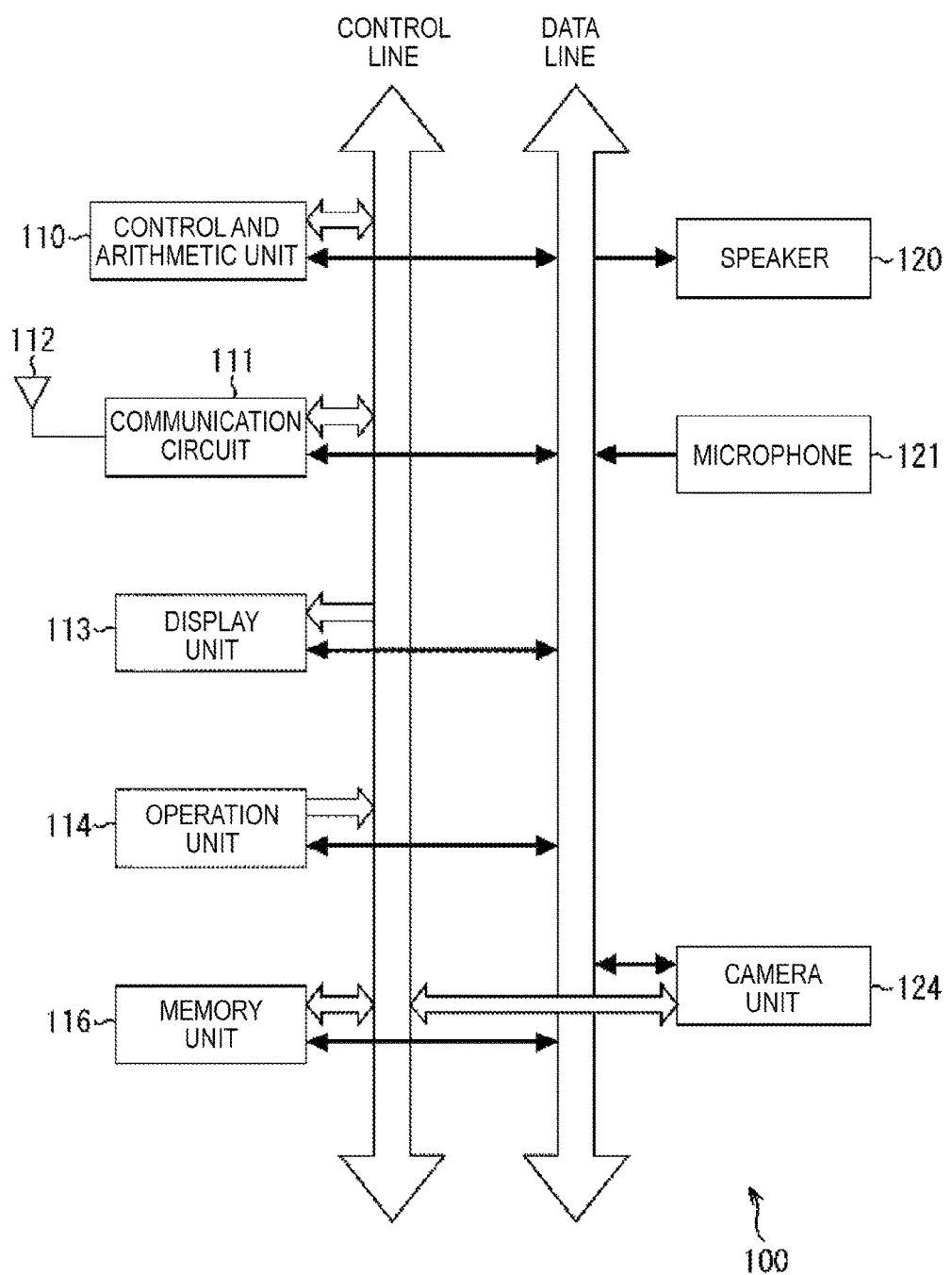
FIG. 33 is a block diagram illustrating an exemplary inner configuration according to an embodiment of a mobile telephone to which the present technology is applied.

As described above, a camera module to which the present technology is applied is to be installed in an electronic device such as a mobile telephone, a smartphone, or the like. FIG. 33 is a block diagram illustrating an exemplary inner configuration according to an embodiment of a mobile telephone to which the present technology is applied.

In a mobile telephone 100 illustrated in FIG. 33, a communication antenna 112 is a built-in antenna, for example, and performs transmission and reception of signal wave for telephone calls and packet communications such as e-mails. A communication circuit 111 performs frequency conversion, modulation, and demodulation of transmission/reception signals.

A speaker 120 is a speaker for receiving voices provided in the mobile telephone 100, or a speaker for outputting ringer (incoming calls), alarm sound, and the like, and converts sound signals supplied from a control and arithmetic unit 110 into acoustic waves and outputs them to the air.

A microphone 121 is a microphone for voice transmission and collection of outside sound, and converts acoustic waves to sound signals and transmits the sound signals to the control and arithmetic unit 110.

A display unit 113 includes a display device such as a liquid crystal display or an organic EL display, and a display drive circuit of the display, and displays various types of characters and images such as e-mails, for example, on the display by image signals supplied from the control and arithmetic unit 110, and if captured images are supplied from the camera unit 124, displays the captured images.

An operation unit 114 is configured of various keys such as numeric keys, a call key, an end/power key, and the like provided on the casing of the mobile telephone 100, various operators such as a cross key, a shutter button, and a horizontal photographing mode switch, and an operation signal generator which generates operation signals when those operators are operated. It should be noted that if the mobile telephone 100 has a touch panel, the touch panel is also included in the operation unit 114.

A camera unit 124 is a function block equivalent to the camera module 50 described above with reference to FIGS. 4 to 16. This means that as the camera unit 124, the camera module 50 to which the present technology is applied is disposed. An image signal captured by the camera unit 124 is applied with various types of image processing by the control and arithmetic unit 110, and then, is displayed on the display screen of the display unit 113, is compressed and stored in a memory unit 116, or the like.

The memory unit 116 includes a built-in memory provided inside the terminal, and a detachable card memory which stores so-called SIM (Subscriber Identity Module) information and the like. The built-in memory includes a ROM (Read Only Memory) and a RAM (Random Access Memory). A ROM is configured of a rewritable ROM such as a NAND-type flash memory or an EEPROM (Electrically Erasable Programmable Read-Only Memory). In the ROM, an OS (Operating System) program, a control program for controlling the respective units by the control and arithmetic unit 110, various application programs, dictionary data, sound data such as incoming call sound and key operation sound, image data captured by the camera unit 124, and the like are stored.

A RAM stores data from time to time, as a work region when the control and arithmetic unit 110 performs various types of data processing.

The control and arithmetic unit 110 is configured of a CPU (central processing unit), and performs control of communications in the communication circuit 111, sound processing and control thereof, image processing and control thereof, control of image capturing by the camera unit 124, control of other various types of signal processing and respective units, and the like. Further, the control and arithmetic unit 110 performs execution of various types of control programs and application programs stored in the memory unit 116, and various types of data processing associated therewith, and the like.

In addition, although not shown, components provided to a typical mobile telephone 100 are also provided, which includes a current position detection unit using GPS (Global Positioning System) satellite waves, a contactless communication unit which performs contactless communications used in a contactless IC card, and the like, a power management IC unit which controls a battery for supplying power to respective units and the power thereof, a slot for external memory, a receiving tuner for digital broadcasting, an AV codec unit, and the like.

While an example in which a camera module, to which the present technology is applied, is installed in a mobile telephone has been described herein, a camera module, to which the present technology is applied, can be installed in various types of electronic devices such as a smartphone and a tablet device.

Further, the embodiment of the present technology is not limited to the above-described embodiment, and various changes can be made within the scope of the gist of the present technology.

It should be noted that the present technology may also be configured as described below.

(1)

A camera module including:

a lens unit that stores a lens that condenses light on a light receiving surface of an image sensor;

a rigid substrate on which the image sensor is disposed; and a flexible substrate electrically connected with the rigid substrate, wherein in a case where the light receiving surface of the image sensor locates at the top, the lens unit, the flexible substrate, and the rigid substrate are disposed in this order from the top.

(2)

The camera module according to (1), wherein in the rigid substrate of a square shape, in an overlap region of a band shape having a predetermined distance from an end of one side of the square, the rigid substrate is disposed to overlap a portion of the flexible substrate, and the rigid substrate and the flexible substrate are attached to each other.

(3)

The camera module according to (2), wherein the overlap region is a band-shaped region having a width of 2.4 mm or less.

(4)

The camera module according to (2), wherein in the flexible substrate, besides the overlap region, a reinforced region in which the flexible substrate overlaps the rigid substrate is provided.

(5)

The camera module according to (4), wherein the reinforced region is provided to extend in parallel with two sides of the image sensor of the square shape.

(6)

The camera module according to (4), wherein the reinforced region is provided to extend in parallel with one side of the image sensor of the square shape.

(7)

The camera module according to any of (1) to (6), wherein in the rigid substrate of a square shape, a solder resist is removed in a band-shaped region having a predetermined distance from an end of one side of the square.

(8)

The camera module according to any of (1) to (7), wherein a groove for accommodating an end portion of the flexible substrate is formed in the lens unit.

(9)

The camera module according to any of (1) to (7), wherein a frame is further provided between the lens unit and the flexible substrate.

(10)

The camera module according to (9), wherein a groove for accommodating an end portion of the flexible substrate is formed in the frame.

(11)

The camera module according to any of (1) to (10), wherein an electrode pad of the image sensor and an embedded electrode provided in the flexible substrate are connected with each other by wire bonding, and a signal output from the electrode pad of the image sensor is transmitted to the rigid substrate through the embedded electrode.

(12) The camera module according to (11), wherein the embedded electrode is formed by punching all layers of the flexible substrate having a multilayer structure to thereby form an opening, and embedding metal in the opening.

(13) The camera module according to any of (1) to (10), wherein the electrode pad is formed by punching an uppermost layer of the flexible substrate having a multilayer structure to thereby form an opening, and embedding metal in the opening, and an electrode pad of the image sensor and the electrode pad provided in the flexible substrate are connected with each other by wire bonding.

(14) The camera module according to any of (1) to (10), wherein an electrode pad of the image sensor and a stud bump protruding on the rigid substrate are connected by wire bonding.

(15) The camera module according to (14), wherein an opening is formed by punching all layers of the flexible substrate having a multilayer structure, and the stud bump is formed on an electrode pad which is on the rigid substrate and is located at a position corresponding to the opening.

(16) The camera module according to any of (1) to (10), wherein in the flexible substrate having a multilayer structure, an opening formed by punching all layers and an opening formed by punching an uppermost layer of the flexible substrate are provided in a region connected with an electrode pad of the image sensor by wire bonding.

(17) The camera module according to (1), wherein an electrode pad of the image sensor and an electrode pad of the rigid substrate are connected with each other by wire bonding, and the electrode pad of the rigid substrate is made common to a connection terminal provided on the rigid substrate for electrically connecting the flexible substrate.

(18) The camera module according to (17), wherein among the electrode pads and the connection terminals of the rigid substrate provided on a plurality of sides of the rigid substrate configured in a rectangle shape, only an electrode pad and a connection terminal provided on one side of the rigid substrate are made common.

(19) The camera module according to (18), wherein among the connection terminals of the rigid substrate provided on the one side, only a connection terminal in a center portion of the side is made common to the electrode pad.

(20) The camera module according to (17), wherein the connection terminal, made common to the electrode pad, is connected with wiring inside the rigid substrate through a via.

(21) A camera module manufactured by a method including the steps of:

disposing a rigid substrate;

connecting a flexible substrate with the rigid substrate; and disposing a lens unit on the rigid substrate, the lens unit storing a lens that condenses light on a light receiving surface of the image sensor, wherein in the step of connecting the flexible substrate with the rigid substrate, in the rigid substrate of a square shape, in an overlap region of a band shape having a predetermined distance from an end of one side of the square, the rigid substrate is disposed to overlap a portion of the flexible substrate, and the rigid substrate and the flexible substrate are attached to each other.

(22) An electronic device including a camera module including:

a lens unit that stores a lens that condenses light on a light receiving surface of an image sensor;

a rigid substrate on which the image sensor is disposed; and a flexible substrate electrically connected with the rigid substrate, wherein in a case where the light receiving surface of the image sensor locates at the top, the lens unit, the flexible substrate, and the rigid substrate are disposed in this order from the top.

REFERENCE SIGNS LIST

50 Camera module
51 Lens unit
52 Frame
53 Rigid substrate
54 Flexible substrate
54e Opening
61 Image sensor
61a Electrode pad
63 Wire
71 Embedded electrode
72 Electrode pad
81 Stud bump
85 Pad
100 Mobile telephone
124 Camera unit

The invention claimed is:

1. A camera module, comprising:

a lens unit that includes a lens configured to condense light on a light receiving surface of an image sensor;

a rigid substrate, wherein the image sensor is on the rigid substrate; and a flexible substrate electrically connected with the rigid substrate, wherein the light receiving surface of the image sensor is located at top, and wherein the lens unit, the flexible substrate, and the rigid substrate are arranged in this order from the top, wherein a first electrode pad of the image sensor and an embedded electrode in the flexible substrate are connected with each other by wire bonding, and wherein the first electrode pad of the image sensor is electrically connected to the rigid substrate through the embedded electrode, and a signal output from the first electrode pad of the image sensor is transmitted to the rigid substrate through the embedded electrode.

2. The camera module according to claim 1, wherein the rigid substrate has a square shape, and wherein, in an overlap of a band shape that has a distance from an end of one side of the rigid substrate, the rigid substrate is arranged to overlap a portion of the flexible substrate, and the rigid substrate and the flexible substrate are attached to each other.

3. The camera module according to claim 2, wherein a region of the overlap is a band-shaped region that has a width of 2.4 mm or less.

4. The camera module according to claim 2, wherein in the flexible substrate, besides a region of the overlap, a reinforced region in which the flexible substrate overlaps the rigid substrate is present.

5. The camera module according to claim 4, wherein the reinforced region extends in parallel with two sides of the image sensor of the square shape.

6. The camera module according to claim 4, wherein the reinforced region extends in parallel with one side of the image sensor of the square shape.

7. The camera module according to claim 1, wherein, in the rigid substrate of a square shape, a solder resist is removed in a band-shaped region that has a distance from an end of one side of the rigid substrate.

8. The camera module according to claim 1, wherein the lens unit has a groove to accommodate an end portion of the flexible substrate.

9. The camera module according to claim 1, further comprising a frame between the lens unit and the flexible substrate.

10. The camera module according to claim 9, wherein the frame has a groove to accommodate an end portion of the flexible substrate.

11. The camera module according to claim 1, wherein the embedded electrode comprises a metal embedded in an opening present in all layers of the flexible substrate having a multilayer structure.

12. The camera module according to claim 1, wherein wherein the flexible substrate has a second electrode pad, wherein the second electrode pad comprises a metal embedded in an opening present in an uppermost layer of the flexible substrate having a multilayer structure, and wherein the first electrode pad of the image sensor and the second electrode pad in the flexible substrate are connected with each other by wire bonding.

13. The camera module according to claim 1, wherein the first electrode pad of the image sensor and a stud bump that protrudes on the rigid substrate are connected by wire bonding.

14. The camera module according to claim 13, wherein an opening is present in all layers of the flexible substrate having a multilayer structure, and wherein the stud bump is present on a third electrode pad which is on the rigid substrate and is located at a position that corresponds to the opening.

15. The camera module according to claim 1, wherein, in the flexible substrate having a multilayer structure, a first opening in all layers and a second opening in an uppermost layer of the flexible substrate are present in a region connected with the first electrode pad of the image sensor by wire bonding.

16. The camera module according to claim 1, wherein the first electrode pad of the image sensor and a third electrode pad of the rigid substrate are connected with each other by wire bonding, and wherein the third electrode pad of the rigid substrate is made common to a first connection terminal present on the rigid substrate to electrically connect the flexible substrate.

17. The camera module according to claim 16, wherein, among a plurality of third electrode pads and a plurality of connection terminals of the rigid substrate present on a plurality of sides of the rigid substrate configured in a rectangle shape, one of the plurality of third electrode pads or a second connection terminal present on one side of the rigid substrate are made common.

18. The camera module according to claim 17, wherein, among the plurality of connection terminals of the rigid substrate present on the one side, a third connection terminal in a center portion of the one side is made common to a corresponding third electrode pad of the plurality of third electrode pads.

19. The camera module according to claim 16, wherein the first connection terminal, made common to the third electrode pad, is connected with wiring inside the rigid substrate through a via.

20. A method for manufacturing a camera module, the method comprising:
connecting a flexible substrate with a rigid substrate; and
placing a lens unit on the rigid substrate, the lens unit including a lens configured to condense light on a light receiving surface of an image sensor,
wherein, in connecting the flexible substrate with the rigid substrate of a square shape, in an overlap region of a band shape having a distance from an end of one side of the rigid substrate, the rigid substrate overlaps a portion of the flexible substrate, and the rigid substrate and the flexible substrate are attached to each other,
wherein an electrode pad of the image sensor and an embedded electrode in the flexible substrate are connected with each other by wire bonding, and
wherein the electrode pad of the image sensor is electrically connected to the rigid substrate through the embedded electrode, and a signal output from the electrode pad of the image sensor is transmitted to the rigid substrate through the embedded electrode.

21. An electronic device, comprising
a camera module including:
a lens unit that includes a lens configured to condense light on a light receiving surface of an image sensor;
a rigid substrate, wherein the image sensor is on the rigid substrate; and
a flexible substrate electrically connected with the rigid substrate,
wherein the light receiving surface of the image sensor is located at top, and wherein the lens unit, the flexible substrate and the rigid substrate are arranged in this order from the top,
wherein an electrode pad of the image sensor and an embedded electrode in the flexible substrate are connected with each other by wire bonding,
wherein the electrode pad of the image sensor is electrically connected to the rigid substrate through the embedded electrode, and
wherein the electrode pad of the image sensor and a stud bump that protrudes on the rigid substrate are connected by wire bonding.

* * * * *